(12) United States Patent
Imazeki et al.

(10) Patent No.: US 9,281,289 B2
(45) Date of Patent: Mar. 8, 2016

(54) SEMICONDUCTOR DEVICE AND METHOD OF MANUFACTURING THE SAME

(71) Applicant: Renesas Electronics Corporation, Kawasaki-shi (JP)

(72) Inventors: Yosuke Imazeki, Kawasaki (JP); Soshi Kuroda, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/329,833

(22) Filed: Jul. 11, 2014

(65) Prior Publication Data

US 2015/0035172 A1 Feb. 5, 2015

(30) Foreign Application Priority Data

Jul. 30, 2013 (JP) ................................. 2013-158233

(51) Int. Cl.
*H01L 23/00* (2006.01)
*H01L 21/56* (2006.01)
*H01L 23/498* (2006.01)

(52) U.S. Cl.
CPC .............. *H01L 24/49* (2013.01); *H01L 21/561* (2013.01); *H01L 23/49838* (2013.01); *H01L 24/06* (2013.01); *H01L 24/85* (2013.01); *H01L 24/97* (2013.01); *H01L 23/49811* (2013.01); *H01L 23/49894* (2013.01); *H01L 24/05* (2013.01); *H01L 24/29* (2013.01); *H01L 24/45* (2013.01); *H01L 24/48* (2013.01); *H01L 24/78* (2013.01); *H01L 24/83* (2013.01); *H01L 2224/05147* (2013.01); *H01L 2224/05155* (2013.01); *H01L 2224/05554* (2013.01); *H01L 2224/05624* (2013.01); *H01L 2224/05644* (2013.01); *H01L 2224/0612* (2013.01); *H01L 2224/2919* (2013.01); *H01L 2224/32145* (2013.01); *H01L 2224/32225* (2013.01); *H01L 2224/45144* (2013.01); *H01L 2224/45147* (2013.01); *H01L 2224/48227* (2013.01); *H01L 2224/48228* (2013.01); *H01L 2224/48465* (2013.01); *H01L 2224/48471* (2013.01); *H01L 2224/48479* (2013.01); *H01L 2224/48624* (2013.01); *H01L 2224/48644* (2013.01); *H01L 2224/48824* (2013.01); *H01L 2224/48844* (2013.01); *H01L 2224/4917* (2013.01); *H01L 2224/4945* (2013.01); *H01L 2224/49171* (2013.01); *H01L 2224/49175* (2013.01);

(Continued)

(58) Field of Classification Search
None
See application file for complete search history.

(56) References Cited

U.S. PATENT DOCUMENTS

2007/0170573 A1* 7/2007 Kuroda et al. ................ 257/686

FOREIGN PATENT DOCUMENTS

JP S 61-105851 A 5/1986

*Primary Examiner* — Fernando L Toledo
*Assistant Examiner* — Lawrence-Linh T Nguyen
(74) *Attorney, Agent, or Firm* — McGinn IP Law Group, PLLC

(57) ABSTRACT

To enhance the reliability of a semiconductor device. The semiconductor device includes a wiring substrate having a plurality of bonding fingers (terminal) formed on a chip-mounting surface, a semiconductor chip mounted on the wiring substrate, a plurality of wires having a ball part and a stitch part respectively. The bonding fingers have a first bonding finger to which the stitch part of the first wire is coupled respectively, and the second bonding finger to which a ball part of the second wire is coupled. In addition, in plan view, the second bonding finger is arranged at a position different from the arrangement of a plurality of first bonding fingers, and the width of the second bonding finger is larger than the width of the first bonding finger.

19 Claims, 26 Drawing Sheets

(52) U.S. Cl.
CPC ............... *H01L 2224/49431* (2013.01); *H01L 2224/49433* (2013.01); *H01L 2224/73265* (2013.01); *H01L 2224/78301* (2013.01); *H01L 2224/83101* (2013.01); *H01L 2224/85181* (2013.01); *H01L 2224/85186* (2013.01); *H01L 2224/85203* (2013.01); *H01L 2224/85205* (2013.01); *H01L 2224/85986* (2013.01); *H01L 2224/92247* (2013.01); *H01L 2224/97* (2013.01); *H01L 2924/10253* (2013.01); *H01L 2924/10271* (2013.01); *H01L 2924/15311* (2013.01); *H01L 2924/181* (2013.01)

SEMICONDUCTOR DEVICE AND METHOD OF MANUFACTURING THE SAME

CROSS-REFERENCE TO RELATED APPLICATION

The disclosure of Japanese Patent Application No. 2013-158223 filed on Jul. 30, 2013 including the specification, drawings and abstract is incorporated herein by reference in its entirety.

BACKGROUND

The present invention relates to a semiconductor device and the manufacturing technology thereof, and relates to a technology that is effective when applied, for example, to a semiconductor device in which an electrode of a semiconductor chip is electrically coupled to a terminal of a wiring substrate via a wire.

In Japanese Patent Laid-Open No. 1986-105851 (Patent Literature 1), there is described a method in which bonding pads provided in two rows in each of two regions facing each other are coupled by wire bonding. In the Patent Literature 1, there is described that, of the bonding pads in two rows, the outside row with respect to the boundary line of respective regions is set to be a first bond and the inside row is set to be a second bond.

There is a technology of electrically coupling a terminal of a wiring substrate to an electrode of a semiconductor chip mounted over the wiring substrate via a wire.

Recently, along with a request for higher functionality of semiconductor devices, the number of the terminals (hereinafter, referred to as terminal number) tends to increase.

However, simple increase in the terminal number results in a larger planar size of the wiring substrate. When each planar size (outside dimension) of a plurality of terminals is made smaller as a countermeasure for this, a margin for stably coupling the wire to the terminal becomes smaller.

The other purposes and the new feature will become clear from the description of the present specification and the accompanying drawings.

SUMMARY

A semiconductor device being an embodiment includes a wiring substrate having a plurality of terminals formed on a chip-mounting surface, a semiconductor chip mounted on the wiring substrate, and a plurality of wires each having a ball part and a stitch part and each being coupled to the terminals. The terminals have a plurality of first terminals to which each stitch part of a plurality of first wires is coupled, and a second terminal to which the ball part of a second wire is coupled. Furthermore, in plan view, the second terminal is arranged at a position different from over the arrangement of the first terminals, and the width of the second terminal is larger than the width of each of the first terminals.

According to the embodiment, the reliability of the semiconductor device can be enhanced.

Figure 1:
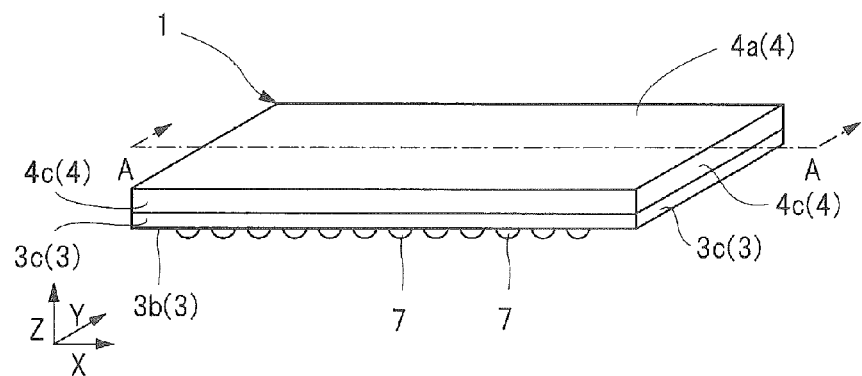
FIG. 1 is a perspective view of the semiconductor device being an embodiment.

DETAILED DESCRIPTION (Explanation of Description Format, Basic Terms and Usage in the Present Application)

In the present application, the embodiment will be described, divided into plural sections or the like if necessary for convenience. Except for the case where it is specified clearly in particular that the case is not to be applied, they are not mutually independent or separated, and, irrespective of before or after the description, are respective parts of a single example, one is a partial detail or a modification of a part or the whole of another, etc. As a principle, the repeated explanation of the similar parts will be omitted. Each of constituent elements in the embodiment is not indispensable, except for cases where it is clearly specified in particular that the case is not to be applied, where it is clearly restricted to the number theoretically, and where it is clear from the context that the case is not to be applied.

Similarly, in the description of the embodiment or the like, when referred to as "X formed of A" for a material, composition or the like, those containing an element other than A are not excluded, except for cases where it is specified clearly in particular that the case is not to be applied, and where it is clear from the context that the case is not to be applied. For example, as to a component, it means "X containing A as a main component," or the like. For example, it is needless to say that a "silicon member" and the like are not restricted to pure silicon, but include SiGe (silicon-germanium) alloy, other multi-component alloys containing silicon as a main component, and other members containing an additive and the like. Furthermore, gold plating, a Cu layer, nickel plating and the like shall include not only pure ones but also members each containing gold, Cu or nickel as a main component, except for the case where it is clearly specified in particular that the case is not to be applied.

Furthermore, when referring to a specific numeric value or numeric quantity, it may be larger or smaller than the specific value, except for cases where it is specified clearly in particular that the case is not to be applied, where it is restricted to the value theoretically, and where it is clear from the context that the case is not to be applied.

In respective drawings of the embodiment, the same or similar parts are shown with the same or similar signs or reference numbers, and the explanation will not be repeated as a principle.

In the accompanying drawings, in the case where it is rather complicated or in the case where the distinction from a void is clear, hatching or the like may be omitted even if it is a cross-section. In association with this, in the case where it is clear from the explanation etc., a profile line of a background may be omitted even if it is a closed hole planarly. Furthermore, even if it is not a cross-section, in order to specify clearly that it is not a void, or to specify clearly the boundary of a region, hatching or a dot pattern may be attached.

The technology explained in the embodiment below is applicable broadly to semiconductor devices in which an electrode pad formed on the surface of a semiconductor chip is electrically coupled to a terminal (bonding finger) of a wiring substrate on which the semiconductor chip is mounted via a wire being a metal wire. In the present embodiment, as an example, the explanation will be given while adopting a semiconductor device of a SiP (System in Package) type in which a plurality of semiconductor chips are stacked over a wiring substrate and are electrically coupled to each other.

Figure 2:
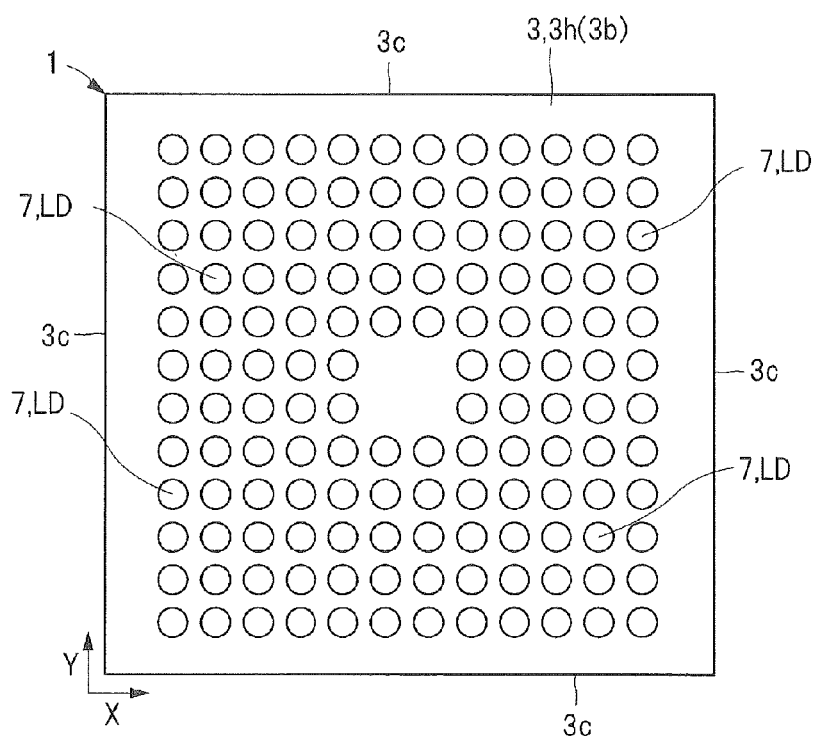
FIG. 2 is a bottom view of the semiconductor device shown in FIG. 1.
Figure 3:
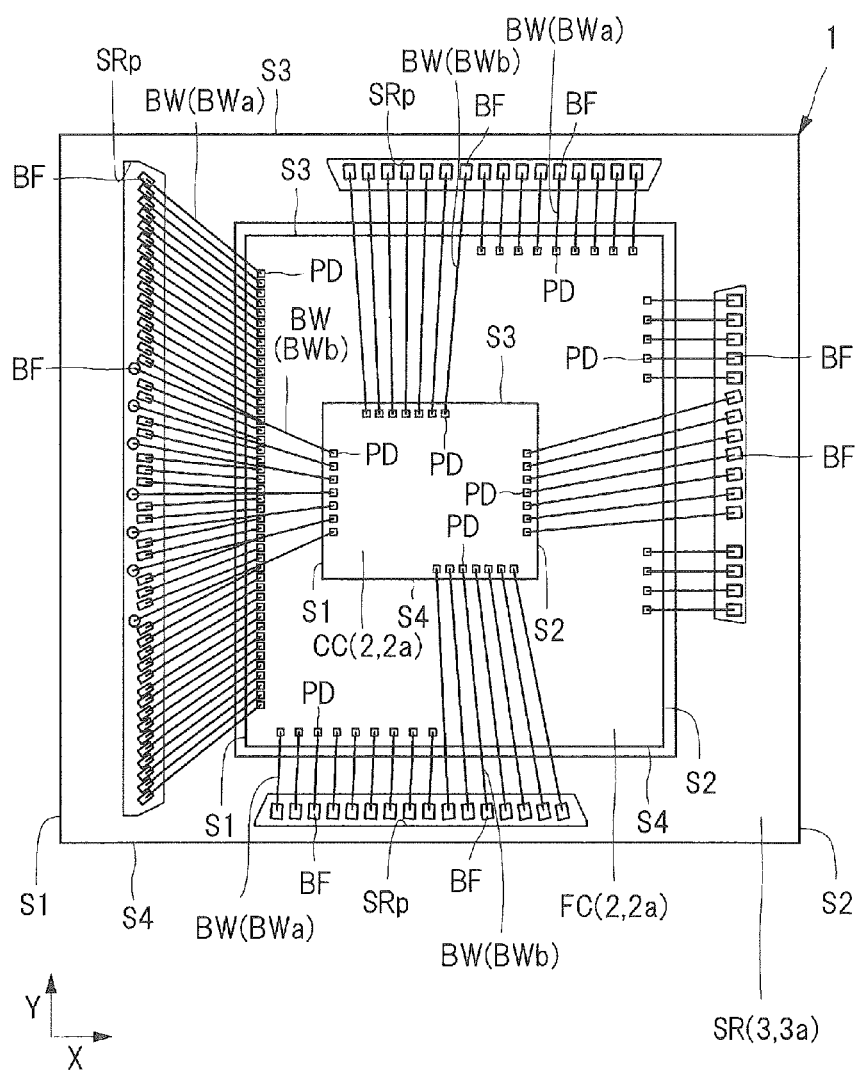
FIG. 3 is a see-through plan view showing the inner structure of the semiconductor device over a wiring substrate in a state where a sealing body shown in FIG. 1 has been removed.
Figure 4:
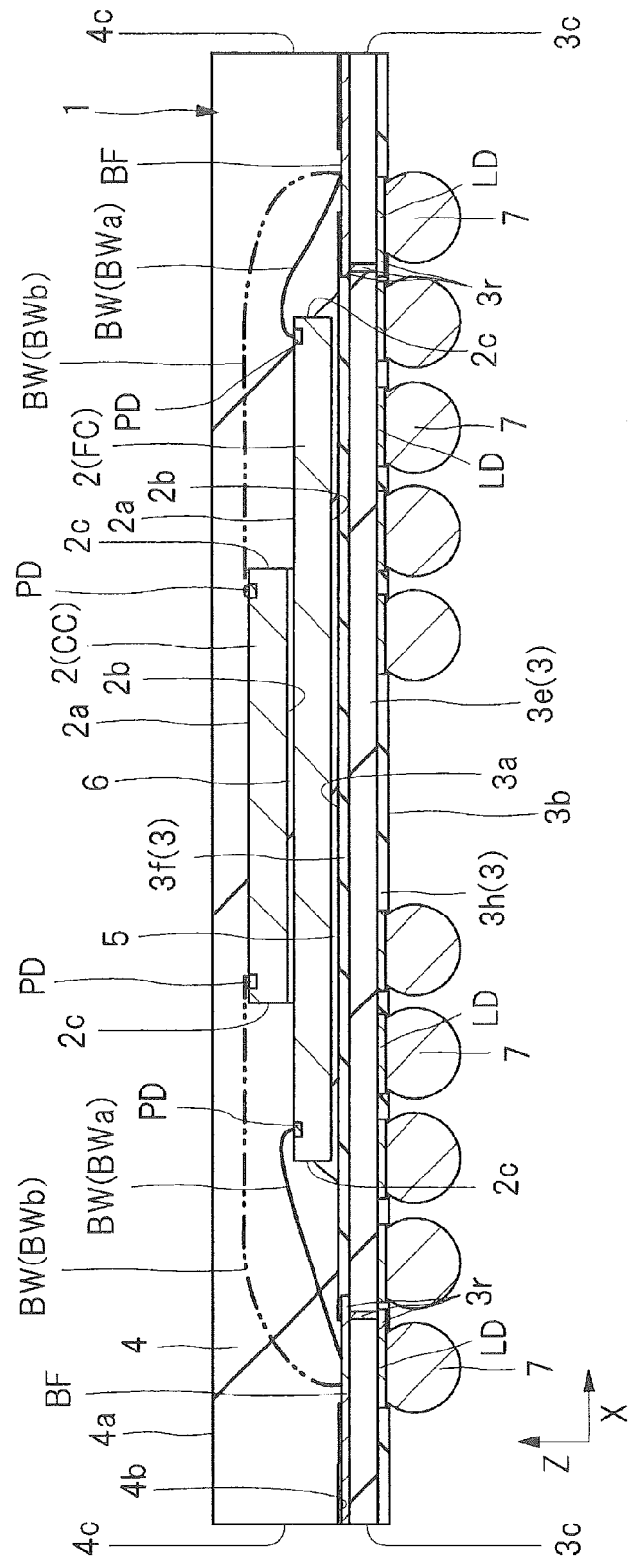
FIG. 4 is a cross-sectional view along an A-A line in FIG. 1.

FIG. 1 is a perspective view of the semiconductor device of the present embodiment, and FIG. 2 is a bottom view of the semiconductor device shown in FIG. 1. FIG. 3 is a see-through plan view showing the inner structure of the semiconductor device over a wiring substrate in a state where a sealing body shown in FIG. 1 has been removed. Furthermore, FIG. 4 is a cross-sectional view along an A-A line in FIG. 1. In FIG. 4, in order to show the difference in loop shapes of a wire BWa of a normal bonding system and a wire BWb of a reverse bonding system, the wire BWb is shown by attaching a two-dot chain line.

<Semiconductor Device>

First, the outline of the configuration of a semiconductor device 1 of the present embodiment will be explained using FIGS. 1 to 4. The semiconductor device 1 of the present embodiment has a plurality of semiconductor chips 2 (see FIGS. 3 and 4), and a wiring substrate 3 on which the semiconductor chips 2 are mounted. As shown in FIG. 4, the semiconductor chips 2 are mounted on an upper surface (chip-mounting surface) 3a side of the wiring substrate 3 so as to be stacked, and each of these is covered with a sealing body (resin body) 4.

In the present embodiment, the semiconductor chip 2 mounted on a lower stage side is, for example, an analog chip (semiconductor chip) FC in which an analog circuit is formed. In addition, the semiconductor chip 2 mounted over the analog chip FC is a controller chip CC in which a control circuit for controlling the analog circuit is formed. A semiconductor package in which the semiconductor chips 2 are mounted within one package as described above is referred to as a multi-chip type semiconductor device. Furthermore, a semiconductor package in which the semiconductor chips 2 mounted within one package are electrically coupled to each other to thereby constitute a system is referred to as a SiP type semiconductor device. In the multi-chip type semiconductor device including the SiP type semiconductor device, a mounting area can be reduced as compared with the case where packaging is performed for every semiconductor chip 2. In particular, when the semiconductor chips 2 are stacked as in the case of the present embodiment, the mounting area can be further reduced as compared with the case where the semiconductor chips 2 are arranged side-by-side.

As shown in FIG. 4, the sealing body 4 has an upper surface 4a, a lower surface 4b positioned on the side opposite to the upper surface 4a, and a side surface 4c positioned between the upper surface 4a and the lower surface 4b, and forms a tetragon in plan view. In an example shown in FIG. 1, the planar area (area in plan view from upper surface 4a side) of the sealing body 4 is the same as the planar area of the wiring substrate 3, and the side surface 4c of the sealing body 4 is continuous to the side surface 3c of the wiring substrate 3.

Planar shapes of the wiring substrate 3 and the sealing body 4 form a tetragon in which the length of one side is, for example, about 6 mm. In addition, in order to respond to the request for thickness reduction of the semiconductor device 1, the sealing body 4 is made thin. The thickness (height) of the sealing body 4, that is, the distance from the upper surface 4a to the lower surface 4b shown in FIG. 4 is, for example, about from 600 μm to 800 μm.

In addition, as shown in FIGS. 3 and 4, each of the semiconductor chips 2 mounted over the wiring substrate 3 has a front surface (main surface, upper surface) 2a, a rear surface (main surface, lower surface) 2b positioned on the side opposite to the front surface 2a (see FIG. 4), and a side surface 2c positioned between the front surface 2a and the rear surface 2b (see FIG. 4). Furthermore, in order to respond to the request for thickness reduction of the semiconductor device 1, the semiconductor chip 2 is made thin. Moreover, the thickness (height) of each of the semiconductor chips 2 is, for example, from about 200 μm to 300 μm. In addition, as shown in FIG. 3, each of the semiconductor chips 2 forms a tetragon in plan view. Furthermore, in the present embodiment, the planar size (planar area) of the semiconductor chip 2 mounted on the upper stage (controller chip CC shown in FIG. 3) is smaller than the planar size (planar area) of the semiconductor chip 2 mounted on the lower stage (analog chip FC shown in FIG. 3).

In detail, as shown in FIG. 3, each of the semiconductor chips 2 has, in plan view, a side S1, a side S2 on the side opposite to the side S1, a side S3 intersecting with the side S1 and the side S2, and a side S4 on the side opposite to the side S3. In addition, the side S1 of the analog chip FC is arranged so as to run along the side S1 of the controller chip CC, and the length of the side S1 of the analog chip FC is longer than the length of the side S1 of the controller chip CC. Furthermore, the side S2 of the analog chip FC is arranged so as to run along the side S2 of the controller chip CC, and the length of the side S2 of the analog chip FC is longer than the length of the side S2 of the controller chip CC. Moreover, the side S3 of the analog chip FC is arranged so as to run along the side S3 of the controller chip CC, and the length of the side S3 of the analog chip FC is longer than the length of the side S3 of the controller chip CC. In addition, the side S4 of the analog chip FC is arranged so as to run along the side S4 of the controller chip CC, and the length of the side S4 of the analog chip FC is longer than the length of the side S4 of the controller chip CC.

Furthermore, in an example shown in FIG. 3, the length of each side of the analog chip FC is longer than each side of the controller chip, and in plan view, the whole of the controller chip CC overlaps the front surface 2a of the analog chip FC. The analog chip FC forms a tetragon, in plan view, having a length of one side of about 3 mm to 5 mm. Moreover, the controller chip CC forms a tetragon, in plan view, having a length of one side of about 1 mm to 2 mm.

On the front surface 2a of the semiconductor chip 2 forming a tetragon in plan view, a plurality of pads PD (terminal, electrode, electrode pad, bonding pad) is arranged, respectively, along respective sides of the front surface 2a. In addition, although illustration is omitted, on the main surface of the semiconductor chip 2 (in detail, semiconductor element-forming region provided on main surface (semiconductor element-forming surface, upper surface) of base material (semiconductor substrate) of semiconductor chip 2), a plurality of semiconductor elements (circuit element) is formed. Then, the pads PD are electrically coupled to the semiconductor element via a wiring (illustration is omitted) formed in a wiring layer arranged inside the semiconductor chip 2 (in detail, between front surface 2a and semiconductor element-forming region not illustrated).

The semiconductor chip 2 (in detail, semiconductor substrate being base material of semiconductor chip 2) is formed of, for example, silicon (Si). In addition, on the front surface 2a, an insulating film covering the base material and wiring of the semiconductor chip 2 is formed, and each front surface of the pads PD is exposed from the insulating film at an opening part formed in the insulating film. Furthermore, the pad PD is formed of a metal, and formed mainly of, for example, aluminum (Al). Meanwhile, for example, when there is applied a so-called re-wiring technology in which another wiring is coupled to the pad PD and the pad is re-arranged at another position, a part of the re-wiring serves as a new pad. In this case, nickel (Ni) is formed on the front surface of the wiring containing copper (Cu) as a main component, and furthermore, gold (Au) is formed over the nickel.

In addition, the analog chip FC and the controller chip CC are mounted over the upper surface 3a of the wiring substrate 3. In the example shown in FIG. 3, the analog chip FC is mounted on the central part of the upper surface 3a of the wiring substrate 3, and the controller chip CC is mounted on the central part of the analog chip FC. Furthermore, as shown in FIG. 4, the analog chip FC is mounted on the wiring substrate 3 via a die bonding material (adhesive) 5 in a state where the rear surface 2b faces the upper surface 3a of the wiring substrate. That is, the analog chip FC is mounted by a so-called face-up mounting system in which the surface (rear surface 2b) opposite to the front surface (main surface) 2a on which the pads PD are formed is caused to face the chip-mounting surface (upper surface 3a). Moreover, the controller chip CC is mounted over the analog chip FC via a die bonding material (adhesive) 6 in a state where the rear surface 2b faces the front surface 2a of the analog chip FC.

The die bonding material 5 is a paste adhesive bonding and fixing the semiconductor chip 2 to the wiring substrate 3, and bonds and fixes the semiconductor chip 2 to the wiring substrate 3 by, for example, curing a paste-like adhesive. The die bonding material 6 is a film adhesive that bonds and fixes the semiconductor chips 2 to each other, which bonds and fixes the semiconductor chips 2 on upper and lower stages by, for example, curing a resin film referred to as a DAF (Die Attach Film), or the like. However, the die bonding materials 5 and 6 are not limited to the above, but for example, the resin film may be used as the die bonding material 5 or the paste adhesive may be used as the die bonding material 6. As to the adhesive used as the die bonding material 5 and/or 6, one having an epoxy resin as a main component is frequently used in both cases of the resin film and the paste adhesive.

In addition, the wiring substrate 3 has, as shown in FIG. 4, the upper surface (chip-mounting surface) 3a on which the semiconductor chip 2 is mounted, the lower surface (mounting surface) 3b on the side opposite to the upper surface 3a, and a plurality of side surfaces 3c arranged between the upper surface 3a and the lower surface 3b. Furthermore, the wiring substrate 3 forms, as shown in FIGS. 2 and 3, a tetragon in plan view.

In detail, as shown in FIG. 3, the wiring substrate 3 has, in plan view, the side S1, the side S2 on the side opposite to the side S1, the side S3 intersecting with the side S1 and the side S2, and the side S4 on the side opposite to the side S3. In the example shown in FIG. 3, it is mounted such that the sides S1, S2, S3 and S4 of the semiconductor chip 2 run along the sides S1, S2, S3 and S4 of the wiring substrate 3, respectively. As described above, in the example shown in FIG. 1, the planar area of the wiring substrate 3 is the same as the planar area of the sealing body 4, and the planar shape of the wiring substrate 3 forms, for example, a tetragon having the length of one side of about 6 mm. In the example shown in FIG. 1, it forms a rectangle. The thickness (height) of the wiring substrate 3, that is, the distance from the upper surface 3a to the lower surface 3b shown in FIG. 4 is, for example, about 0.2 mm to 0.4 mm.

In addition, the wiring substrate 3 has a plurality of wiring layers (in example shown in FIG. 4, two layers of upper surface wiring layer and lower surface wiring layer). An insulating layer 3e arranged between respective wiring layers is constituted of, for example, a prepreg obtained by impregnating resin into glass fiber or carbon fiber. Furthermore, on the upper surface side of the insulating layer 3e, a plurality of bonding fingers BF is formed, and on the lower surface side of the insulating layer 3e, a plurality of lands LD is formed, and the bonding fingers BF and the lands LD are electrically coupled via a plurality of wirings 3r, respectively.

In addition, as shown in FIG. 3, on the upper surface 3a of the wiring substrate 3, the bonding fingers (terminal, chip-mounting surface side terminal, bonding lead) BF are formed, the finger being a terminal for an internal interface for electrically coupling the wiring substrate 3 to the semiconductor chip 2. The bonding fingers BF are arranged around a chip-mounting region in which the semiconductor chip 2 is mounted along respective sides of the semiconductor chip. In detail, on the upper surface 3a of the wiring substrate 3, a solder resist film (insulating film) SR covering the wiring formed on the upper surface side of the insulating layer 3e is formed, and at an opening part SRp formed in the solder resist film SR, the bonding fingers BF are exposed from the solder resist film SR.

The pads PD of the semiconductor chip 2 and the bonding fingers BF of the wiring substrate 3 are electrically coupled to each other via a plurality of wires (electroconductive member) BW, respectively. Meanwhile, the wires BW in the present embodiment are formed of, for example, gold (Au), but as a material other than this, a wire formed of, for example, a metal containing copper (Cu) as a main component may be used. Details of the bonding finger BF and the wire BW will be described later.

As shown in FIG. 2, on the lower surface 3b of the wiring substrate 3, the lands (external terminal, electrode pad, external electrode pad) LD are formed. The lands LD are arranged in a line-column shape (matrix shape). The lands LD are, as shown in FIG. 4, electrically coupled to the bonding fingers BF via the wirings 3r formed on the wiring substrate 3, respectively. That is, each of the lands LD is electrically coupled to each of the semiconductor chips 2, and is a terminal for an external interface that electrically couples the semiconductor chips 2 to an external device not illustrated.

The semiconductor device, in which external terminals are arranged in a line-column shape on the mounting surface side of the wiring substrate as described above, is referred to as a semiconductor device of an area array type. The semiconductor device of the area array type can utilize effectively the mounting surface (lower surface 3b) side of the wiring substrate 3 as an arrangement space of an external terminal, and thus the semiconductor device of the area array type is preferable in that the increase in the mounting area of the semiconductor device can be suppressed even when the number of external terminals increases. That is, a semiconductor device having an increased number of external terminals along with higher functionality and higher integration can be mounted with a small space.

Meanwhile, in FIG. 2, an example in which the number of external terminals is 140 is shown, but the terminal number or layout is not restricted to this. In FIG. 4, the wiring substrate 3 in which wiring layers are formed on each of the upper surface and lower surface of the insulating layer 3e is shown in an exemplified manner, but the number of the wiring layers is not restricted to this and a wiring layer structure having more than two layers is also possible.

The bonding finger BF, land LD and wiring 3r constituting a conductive path of the wiring substrate 3 shown in FIG. 4 are formed by patterning a metal film and are formed of, for example, an electroconductive film containing copper (Cu) as a main body. Furthermore, among the wirings 3r, the wiring 3r causing the upper surface side and the lower surface side of the insulating layer 3e to be conducted is formed by, for example, embedding a metal film in a through-hole, and is constituted of, for example, an electroconductive film containing copper (Cu) as a main body. Here, the electroconductive film containing copper as a main body includes a copper single body, a copper alloy and a metal film in which another metal film (such as a nickel film) is stacked over a copper film, and these materials can be selected in accordance with the specification required for the wiring substrate 3.

Furthermore, each of the lands LD is exposed from a solder resist film (insulating film) 3h covering the lower surface 3b of the wiring substrate 3. In detail, on the lower surface 3b of the wiring substrate 3, the solder resist film (insulating film) 3h covering the wiring formed on the lower surface side of the insulating layer (core insulating layer) 3e is formed, and at a plurality of opening parts formed in the solder resist film 3h, each of the lands LD is exposed from the solder resist film 3h.

In addition, in the present embodiment, each of exposed surfaces of the lands LD is covered with a solder material 7. When mounting the semiconductor device 1 on a mounting substrate not illustrated, solder is frequently used as an electroconductive joining material that electrically couples the terminal on the mounting substrate side to the semiconductor device 1. Accordingly, by forming the solder material 7 on the exposed surface of the land LD being an external terminal from the solder resist film 3h, wettability of the solder can be enhanced when the semiconductor device 1 is mounted on the mounting substrate not illustrated. When the solder material 7 is formed in a ball shape as shown in FIGS. 1, 2 and 4, it is referred to as a BGA (Ball Grid Array) type. In addition, although the illustration is omitted, semiconductor devices having a structure in which the solder material 7 is not formed but the land LD is exposed, or semiconductor devices in modifications in which a plating film formed of the solder material or a metal material other than the solder material is formed thinly on the exposed surface of the land LD is referred to as an LGA (Land Grid Array) type.

The solder material 7 is configured of so-called lead-free solder that substantially does not contain lead (Pb), and is formed of, for example, tin (Sn) alone, tin-bismuth (Sn—Bi), tin-silver-copper (Sn—Ag—Cu) or the like. Here, the lead-free solder means one in which the content of lead (Pb) is 0.1 wt % or less, and the content is defined as the standard of RoHS (Restriction of Hazardous Substances) instruction. Hereinafter, when solder is explained in the present application, it denotes lead-free solder except for the case where it is specified clearly in particular that the case is not to be applied.

<Details of Wire and Bonding Finger>

Figure 5:
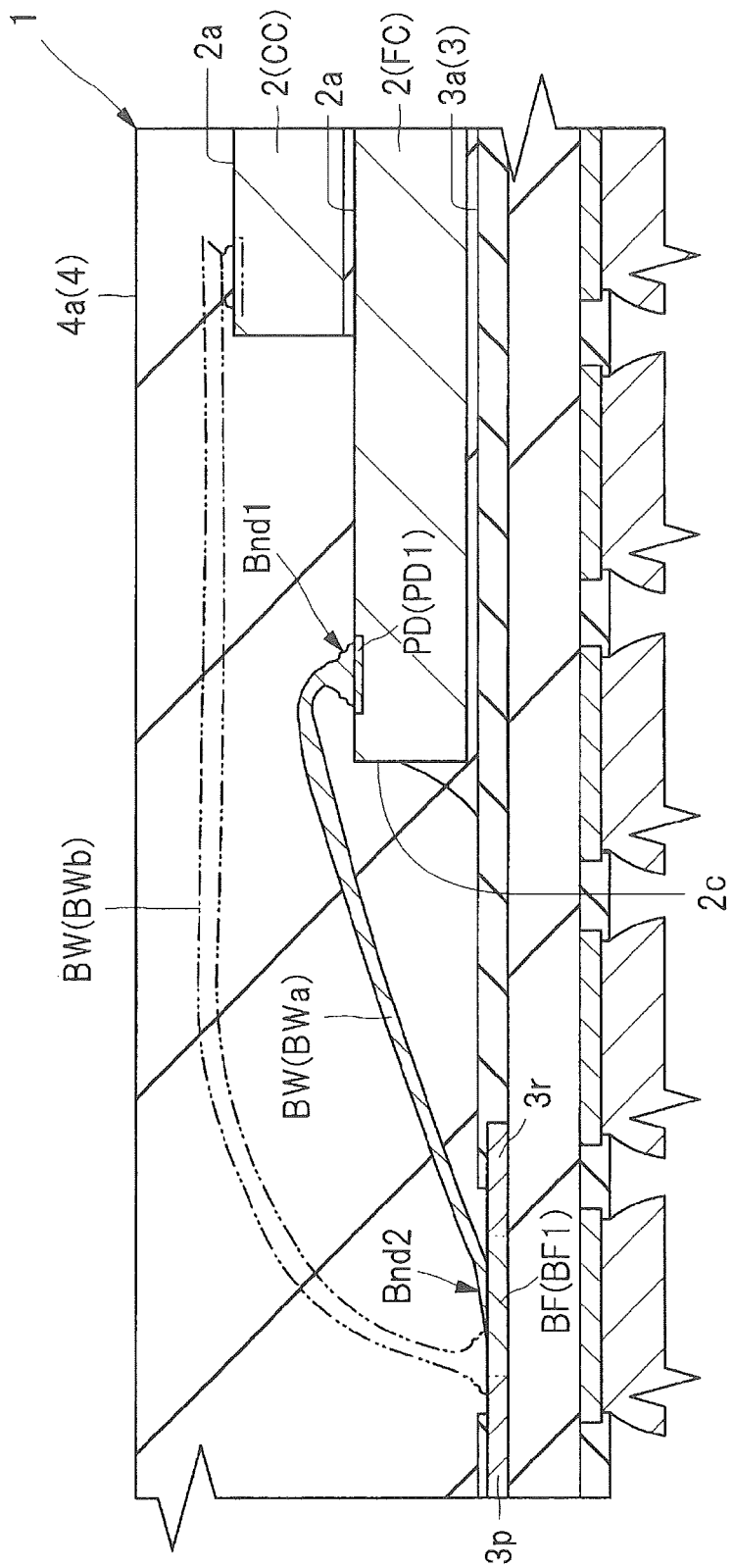
FIG. 5 is an enlarged cross-sectional view showing a wire that electrically couples a semiconductor chip on a lower stage side to the wiring substrate among a plurality of wires shown in FIG. 3.
Figure 6:
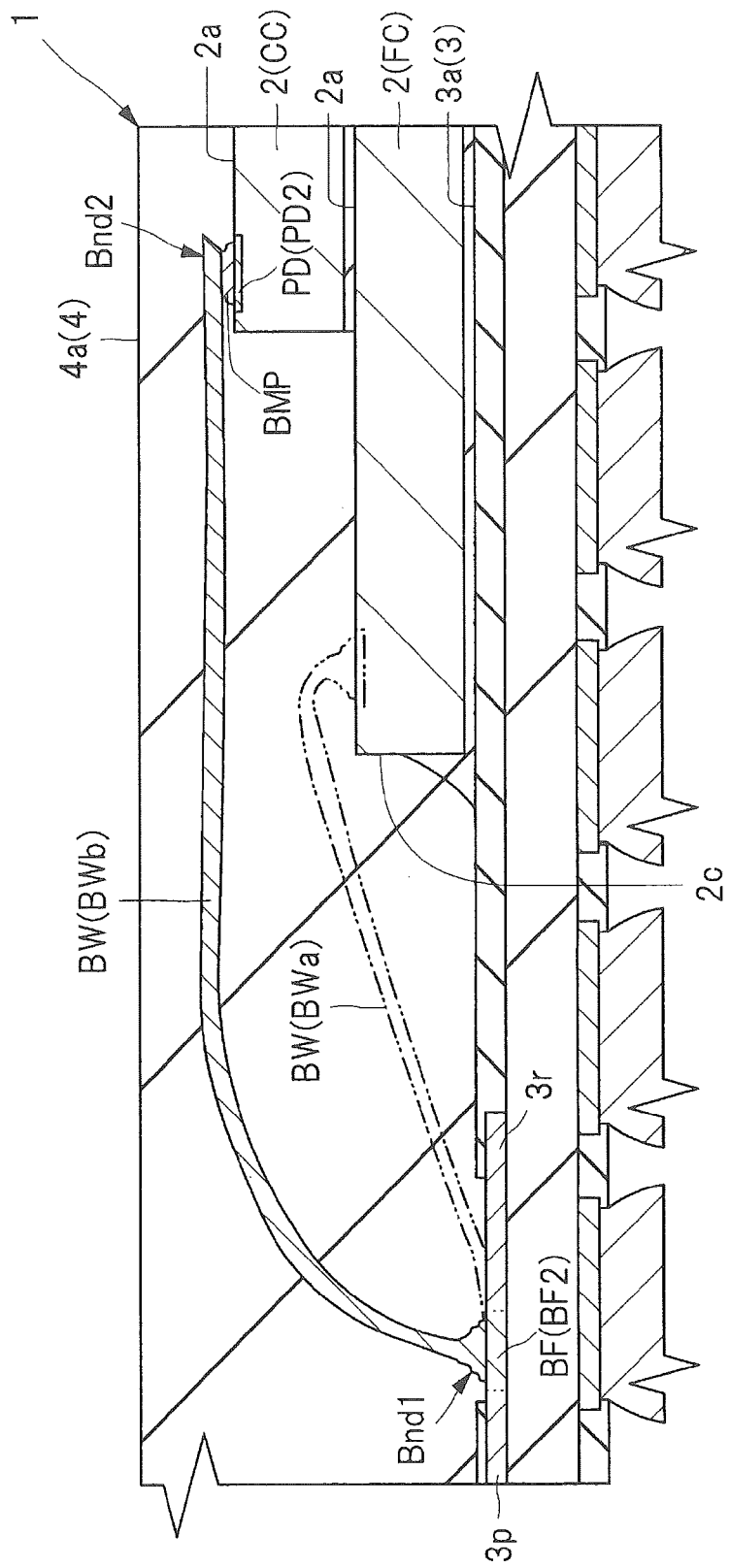
FIG. 6 is an enlarged cross-sectional view showing a wire that electrically couples a semiconductor chip on an upper stage side to the wiring substrate among the wires shown in FIG. 3.
Figure 7:
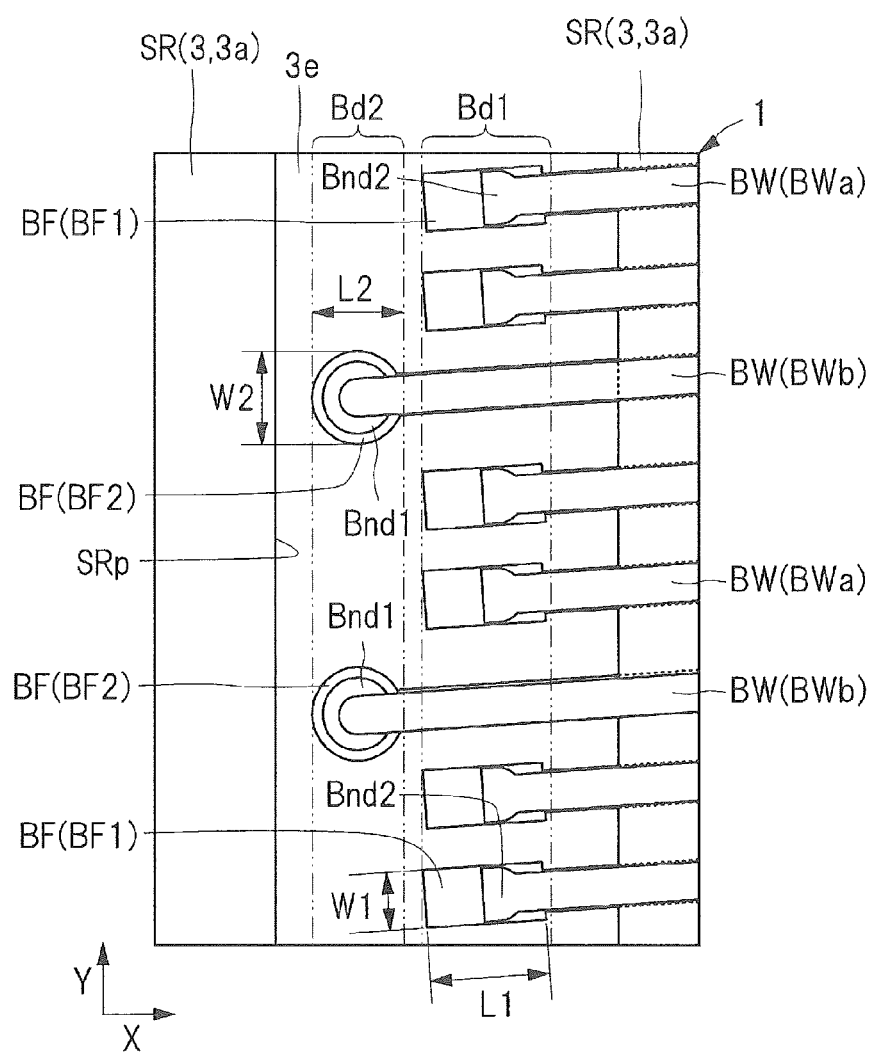
FIG. 7 is an enlarged plan view showing, in an enlarged manner, a region having high arrangement density of bonding fingers in plane on the chip-mounting surface side of the wiring substrate shown in FIG. 3.
Figure 8:
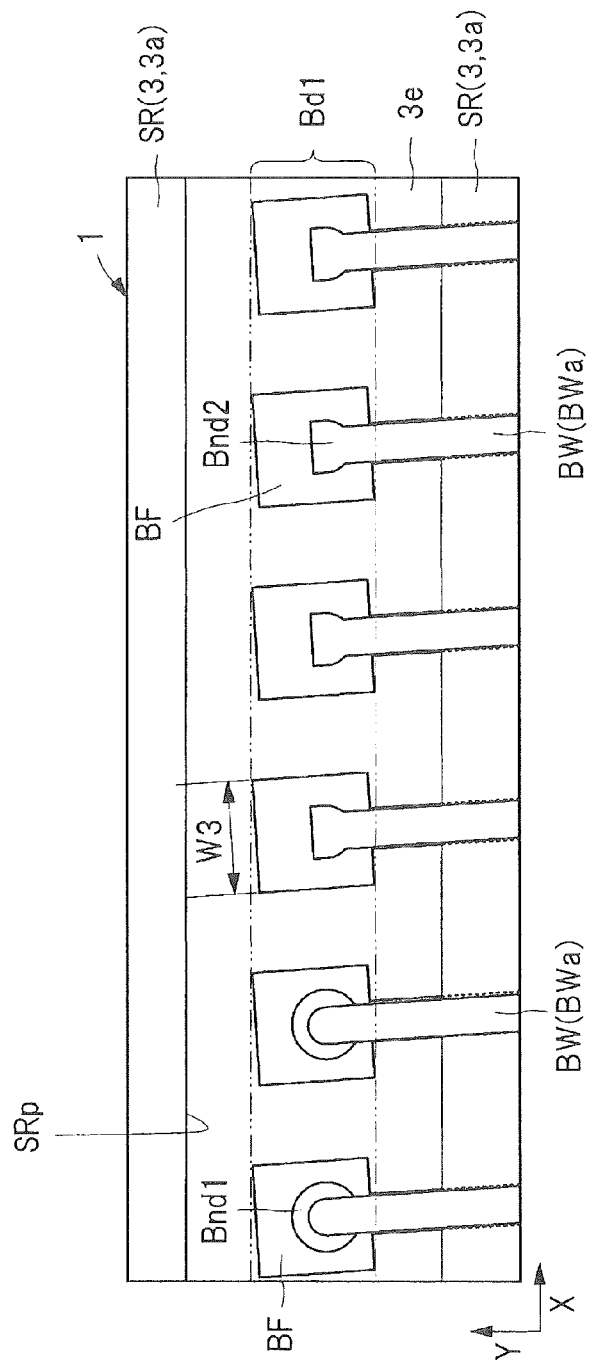
FIG. 8 is an enlarged plan view showing, in an enlarged manner, a region having an arrangement density of bonding fingers lower than that of the region shown in FIG. 7.
Figure 27:
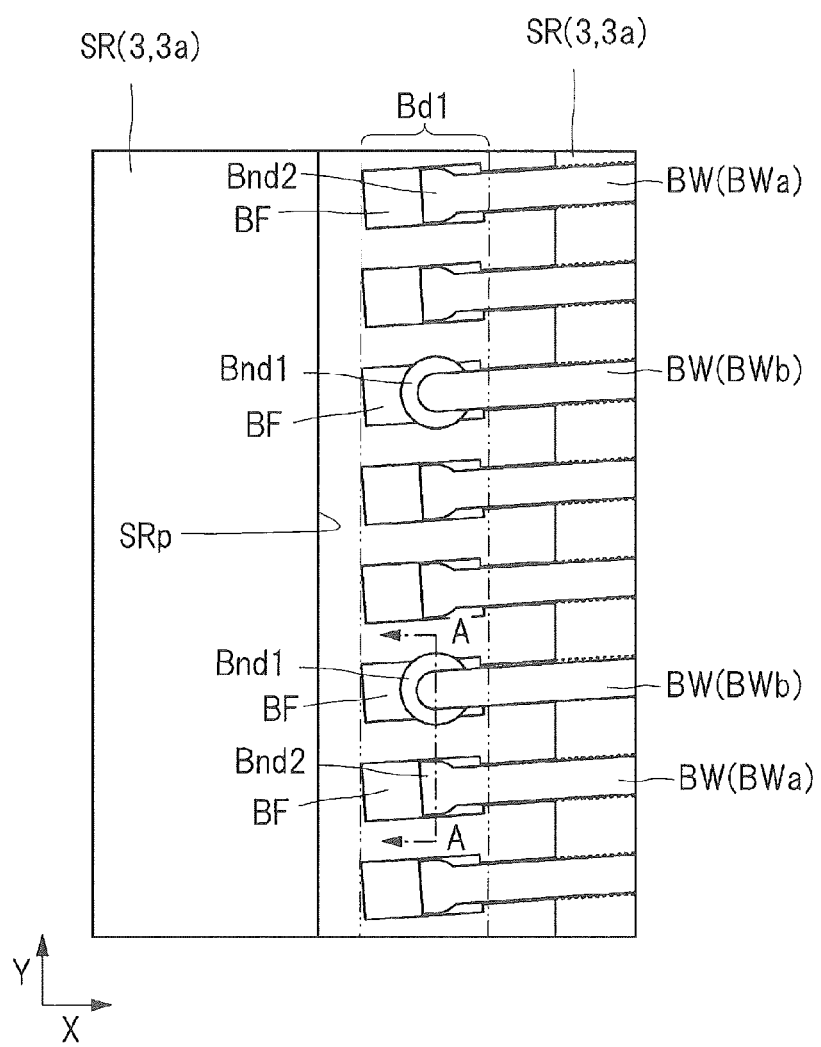
FIG. 27 is an enlarged plan view showing an embodiment in which the shape or size of the bonding finger is different from that of the embodiment shown in FIG. 7.
Figure 28:
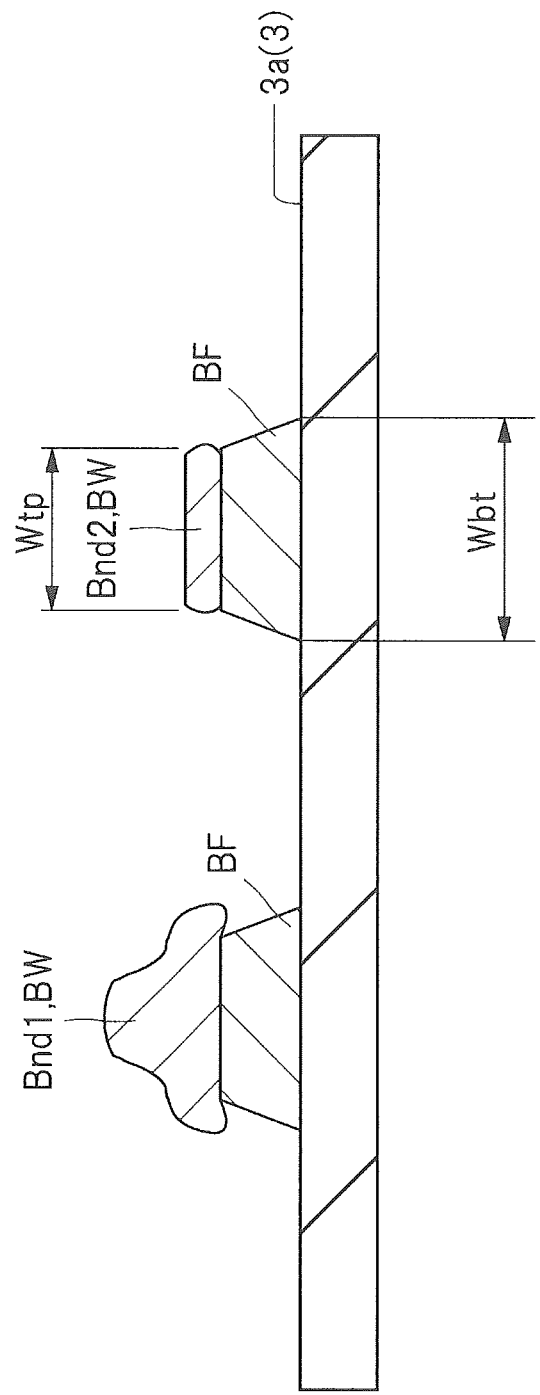
FIG. 28 is an enlarged cross-sectional view along an A-A line in FIG. 27.
Figure 29:
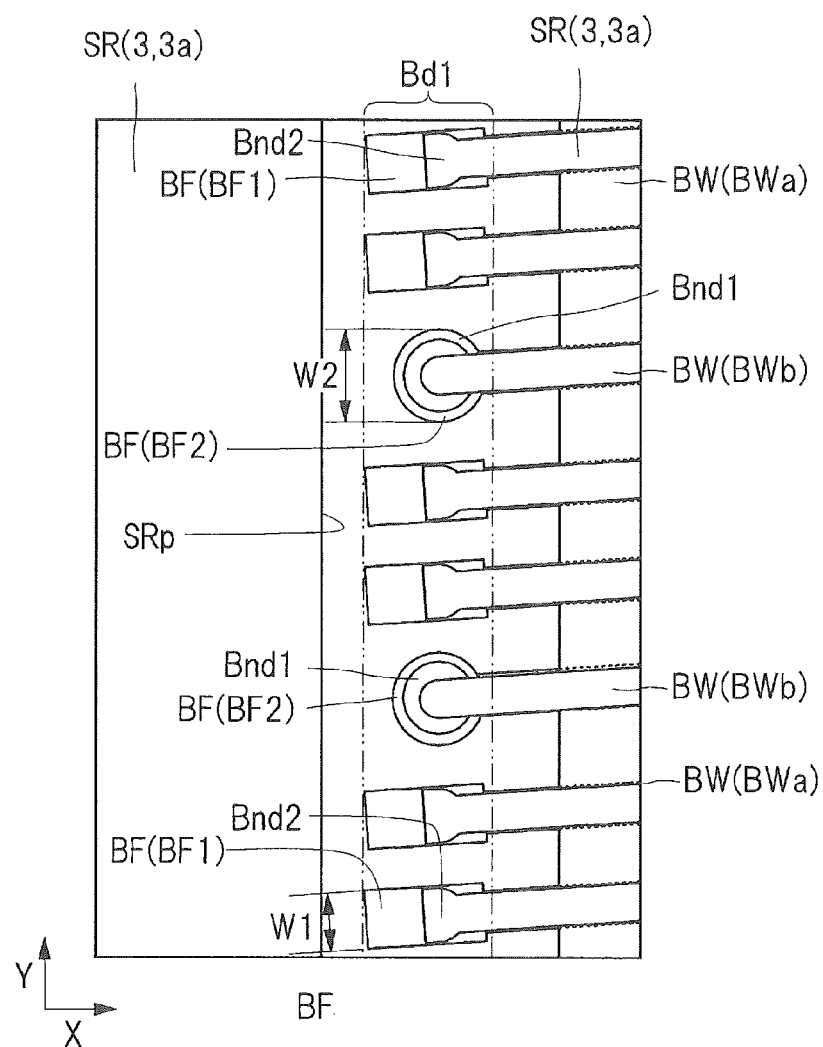
FIG. 29 is an enlarged plan view showing an embodiment in which the shape or size of the bonding finger is different from that in the embodiment shown in FIG. 7.
Figure 30:
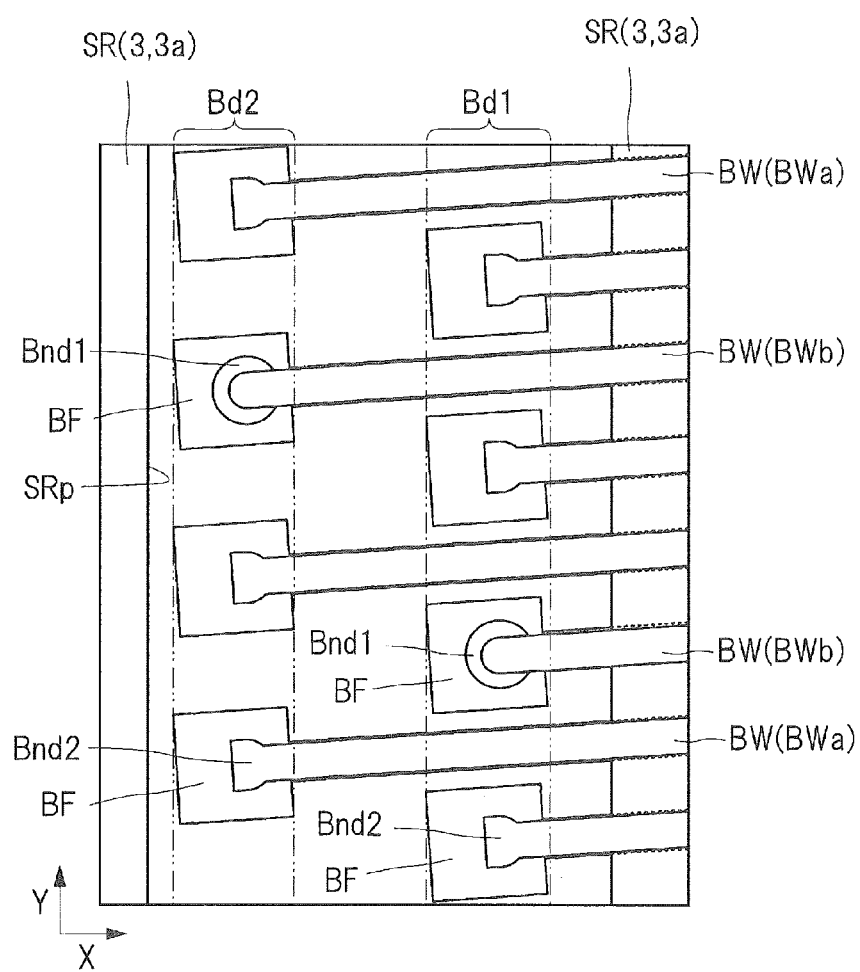
FIG. 30 is an enlarged plan view showing an embodiment in which the shape or size of the bonding finger is different from that in the embodiment shown in FIG. 7.

Next, a detailed structure of an electrical coupling part by the wire BW shown in FIGS. 3 and 4 will be explained. FIG. 5 is an enlarged cross-sectional view showing a wire that electrically couples a semiconductor chip on a lower stage side to the wiring substrate, among the wires shown in FIG. 3. In addition, FIG. 6 is an enlarged cross-sectional view showing a wire that electrically couples a semiconductor chip on an upper stage side to the wiring substrate, among the wires shown in FIG. 3. Furthermore, FIG. 7 is an enlarged plan view showing, in an enlarged manner, a region having high arrangement density of bonding fingers in a plane on the chip-mounting surface side of the wiring substrate shown in FIG. 3. Moreover, FIG. 8 is an enlarged plan view showing, in an enlarged manner, a region having an arrangement density of bonding fingers lower than that of the region shown in FIG. 7. In addition, each of FIGS. 27, 29 and 30 is an enlarged plan view showing an embodiment in which the shape or size of the bonding finger is different from that of the embodiment shown in FIG. 7. Furthermore, FIG. 28 is an enlarged cross-sectional view along an A-A line in FIG. 27.

Meanwhile, in FIGS. 5 and 6, in order to show the difference in loop shapes of the wire BWa by the normal bonding system and the wire BWb by the reverse bonding system, each of the wire BWb in FIG. 5 and the wire BWa in FIG. 6 is shown by attaching a two-dot chain line. FIG. 7 is plan view in which a part of a bonding finger group along the side S1 among four sides the semiconductor chip 2 has, shown in FIG. 3, is enlarged, and FIG. 8 is plan view in which a part of a bonding finger group along the side S3 is enlarged. In the bonding finger BF shown in FIGS. 7 and 8, a feeder wire for forming a metal pattern by electroplating method is formed, but, in FIGS. 7 and 8, the illustration of the feeding wire is omitted for making the drawings easily viewable. Furthermore, in FIGS. 7 and 8, the wiring 3r shown in FIG. 4 is formed in the position overlapping the wire BW, but the sign of the wiring 3r is omitted for making the drawings easily viewable. An example of the layout of the wiring 3r and the feeder wire will be shown in FIG. 11 to be described later.

As shown in FIG. 3, in the present embodiment, the pads PD and the bonding fingers BF are electrically coupled to each other via the wires BW, respectively. The wire BW is a metal thin wire, in which one end part is coupled to the pad PD and the other end part is coupled to the bonding finger BF. A method of bonding a wire when electrically coupling the semiconductor chip 2 to the wiring substrate 3 can be classified into two types depending on the difference in coupling orders.

First, there is the so-called normal bonding system in which the first bond side (terminal to be coupled earlier) is the pad PD of the semiconductor chip 2, and the second bond side (terminal to be coupled later) is the bonding finger BF of the wiring substrate 3. Furthermore, there is the so-called reverse bonding system in which the first bond side is the bonding finger BF of the wiring substrate 3, and the second bond side is the pad PD of the semiconductor chip 2.

In the case of the normal bonding system, as the wire BWa shown in FIG. 5, one end part of the wire BW is coupled to the pad PD of the semiconductor chip 2 being the first bond side, for example, by a ball bonding system. In the ball bonding system, a ball part Bnd1 being a spherical metal lump formed at the tip of a wire is brought into contact with the pad PD and is pressed with capillary not illustrated, and thus the pad PD is thermally pressure-bonded to the ball part Bnd1. At this time, the joining property between the pad PD and the ball part Bnd1 may be enhanced by applying ultrasonic waves from the capillary.

The end part on the side opposite to the ball part Bnd1 is coupled to the bonding finger BF of the wiring substrate 3 being the second bond side by, for example, a stitch bonding system. In the stitch bonding system, after bringing a part of the wire BW into contact with the bonding finger BF being the second bond side, while pressing the wire BW to the bonding finger BF with a capillary not illustrated, a part of the wire BW is moved along the extending direction of the bonding finger BF. By the action of the capillary, the end part of the wire BW on the second bond side is compressed and is deformed plastically, and a stitch part Bnd2 is formed.

On the other hand, in the case of the reverse bonding system, since the bonding finger BF of the wiring substrate 3 serves as the first bond side like the wire BWb shown in FIG. 6, one end part of the wire BW is coupled to the bonding finger BF of the wiring substrate 3 by the ball bonding system. In other words, to the bonding finger BF, the ball part Bnd1 is coupled. To the coupling part with the pad PD of the semiconductor chip 2 being the second bond side, the other end part of the wire BW is coupled by the stitch bonding system.

As described above, in the case of the ball part Bnd1, since a spherical metal lump is pressed to a part to be coupled and is formed, the planar shape becomes circular (including elliptical) as shown in FIG. 7. On the other hand, since the stitch part Bnd2 is formed by moving the capillary along the extending direction of the bonding finger BF while pressing the wire BW to the bonding finger BF, the planar shape becomes semi-elliptical (including semi-circular) as shown in FIG. 7.

Here, when coupling the wire BW to the pad PD of the semiconductor chip 2 shown in FIG. 3 by the stitch bonding system, the wire BW can also be coupled directly to the pad PD. In this case, the stitch part Bnd2 and the pad PD shown in FIG. 6 are joined to each other. However, in the case of the stitch bonding system, as described above, by moving the capillary not illustrated in the plane direction while pressing a part of the wire BW to the target to be coupled, the coupling strength can be enhanced. Accordingly, from the viewpoint of reducing stress applied to the periphery of the pad PD of the semiconductor chip 2 due to the capillary action, it is preferable to interpose a bump electrode BMP between the pad PD and the stitch part Bnd2, as shown in FIG. 6. The bump electrode BMP is a protruding electrode formed so as to project over the pad PD, and, for example, is formed of gold (Au). The bump electrode BMP formed of gold can be formed by applying the ball bonding system described above. That is, after joining a ball-like part (ball part) formed at the end part of a wire to the pad PD, the wire is cut at the vicinity of the joining part. This can form the bump electrode BMP.

In the present embodiment, the wires BW shown in FIG. 3 includes the wire BWa formed by the normal bonding system, and the wire BWb formed by the reverse bonding system. As to the reason why the normal bonding system and the reverse bonding system coexist, there are various reasons, and in the present embodiment, the wire BWa by the normal bonding system is coupled to the analog chip FC on the lower stage side and the wire BWb by the reverse bonding system is coupled to the controller chip CC on the upper stage side.

As shown in FIG. 6, the wire BWb formed by the reverse bonding system is arranged so that the position of the second bond side is higher (position relatively more close to the upper surface 4a of sealing body 4) than the position of the first bond side. Accordingly, by forming all wires BW to be coupled to the semiconductor chip 2 arranged on the upper stage side by the reverse bonding system, the reduction of the wire height of the wire BWb makes it possible to reduce the thickness of the sealing body 4. On the other hand, the pad PD of the semiconductor chip 2 on the lower stage side is arranged at a position lower than the pad of the semiconductor chip 2 on the upper stage side, and thus, as shown in FIG. 5, the highest point of a wire loop of the wire BWa is arranged at a position lower than the highest point of a wire loop of the wire BWb, even when the wire BWb is formed by the normal bonding system. Accordingly, by forming the wire BW to be coupled to the semiconductor chip 2 on the lower stage side by the normal bonding system, the formation of the bump electrode BMP (see FIG. 6) or the like is unnecessary and the manufacturing efficiency can be enhanced.

Furthermore, as shown in FIG. 3, in the semiconductor device 1 of the present embodiment, the bonding fingers BF are arranged along the respective sides of the semiconductor chip 2, respectively, in plan view. As to the number of the bonding fingers BF arranged along respective sides, various modifications can be applied, and, in the example shown in FIG. 3, the number of the bonding fingers BF arranged along the side S1 of the semiconductor chip 2 is larger than the number of the bonding fingers BF arranged along other sides S2, S3 and S4. The bonding finger BF is the terminal for an internal interface of the semiconductor device 1 as described above, and thus the number of the bonding fingers BF arranged along the respective sides of the semiconductor chip 2 may differ from each other, depending on the layout of a circuit included by the semiconductor chip 2.

In the example of the present embodiment, among the pads PD included by the analog chip FC arranged on the lower stage side, the pads PD that output/input switching signal for the analog circuit are arranged intensively, on the side S1 side. By arranging intensively the pads PD for input/output of signal along one side of the semiconductor chip 2 as described above, for example, making a signal transmission distance be equal can be easily achieved. Furthermore, the pad PD performing input/output of signal with the analog chip FC among the pads PD included by the controller chip CC arranged on the upper stage side is preferably arranged such that the transmission distance between the analog chip FC and the controller chip CC becomes shorter. As the result, a part among the pads PD included by the controller chip CC is arranged along the side S1 of the controller chip CC. Then, the wire BWb to be coupled to the pad PD arranged along the side S1 of the controller chip CC is coupled to the bonding finger BF arranged along the side S1 of the analog chip FC. In addition, when versatility is to be given to the controller chip CC, the pads PD of the controller chip CC are arranged along the respective sides of the controller chip CC. Accordingly, a part of the wires BW to be coupled to the controller chip CC is coupled to the bonding finger BF arranged along the side S1 of the semiconductor chip 2, among the bonding fingers BF of the wiring substrate 3.

As described above, in the present embodiment, the number of the bonding fingers BF arranged along the side S1 among respective sides of the semiconductor chip 2 is larger than the number of the bonding fingers BF arranged along other sides S2, S3 and S4. Furthermore, the wires BW coupled to the bonding fingers BF arranged along the side S1 of the semiconductor chip 2 are in the state where the wire BWa by the normal bonding system and the wire BWb by the reverse bonding system coexist.

Here, when the number of the bonding fingers BF increases, in order to suppress the increase in the entire planar size of the semiconductor device 1, it becomes necessary to reduce the width of each bonding finger BF and the arrangement space thereof. For example, among groups of a plurality of bonding fingers shown in FIG. 3, the width of the bonding finger BF configuring the bonding finger group arranged along the side S1 of the semiconductor chip 2 is narrower than the width of the bonding finger BF configuring the bonding finger groups arranged along the sides S2, S3 and S4, respectively.

When coupling the bonding finger BF to the wire BW by the ball bonding system, from the viewpoint of stabilizing the wire loop shape, or from the viewpoint of improving the joining strength of the wire BW and the bonding finger BF, the adhesion area of the ball part Bnd1 to the bonding finger BF (see FIG. 6) is preferably made larger. For example, the adhesion area of the ball part Bnd1 to the bonding finger BF can be made larger when the entire ball part Bnd1 overlaps the bonding finger BF as shown in FIG. 7, as compared with a state where a part of the ball part Bnd1 protrudes from the bonding finger BF as shown in FIG. 27, in plan view.

In detail, as shown in FIG. 28, the bonding finger BF has a cross-sectional shape of a trapezoid when it is cut in the direction orthogonal to the extending direction. That is, a width Wtp of the upper surface being the joining surface with the wire BW of the bonding finger BF is narrower than a width Wbt of the lower surface (face adheres to upper surface 3a of wiring substrate 3). For example, when a design dimension is set to be 55 μm and the formation is performed such that the width Wbt of the lower surface becomes 55 μm, the width Wtp of the upper surface becomes about 40 μm. Therefore, for example, when the width of the ball part Bnd1 is at the same level as the design dimension of the bonding finger BF, at the joining surface of the ball part Bnd1 and the bonding finger BF, apart of the ball part Bnd1 protrudes. Here, the width of the ball part Bnd1 is, in plan view, the length of the ball part Bnd1 in the direction orthogonal to the extending direction of the wire BWb (see FIG. 7). When the planar shape of the ball part Bnd1 is considered to be circular, it is also possible to rephrase the width of the ball part Bnd1 as the diameter of the ball part Bnd1.

On the other hand, when coupling the bonding finger BF to the wire BW by the stitch bonding system, the bonding finger BF and the wire BW are joined by moving the capillary along the extending direction of the bonding finger BF while compressing a part of the wire BW, as described above. Accordingly, only if the extension distance of the bonding finger BF can be secured, the width of the bonding finger BF may be narrow. In addition, when the width of the stitch part Bnd2 is narrower than the width of the ball part Bnd1, as shown in FIG. 28, the stitch part Bnd2 hardly protrudes from the bonding finger BF. Here, the width of the stitch part Bnd2 is, in plan view, the largest length of the stitch part Bnd2 in the direction orthogonal to the extending direction of the wire BWa (see FIG. 7). When considering the planar shape of the stitch part Bnd2 as a semicircle, the width of the stitch part Bnd2 can also be rephrased as the diameter of the stitch part Bnd2.

The present inventors examined on the embodiment in which, as shown in FIG. 29, the bonding finger BF2 to be coupled to the ball part Bnd1 has the width W2 larger than the width W1 of the bonding finger BF1 to be coupled to the stitch part Bnd2, and the bonding fingers BF1 and BF2 are formed in a row. In the case of the embodiment shown in FIG. 29, the adhesion area of the ball part Bnd1 to the bonding finger BF becomes larger than that in the embodiment shown in FIG. 27. Furthermore, since the width of the bonding finger BF2 to be coupled to the ball part Bnd1 is selectively made large, in comparison with the embodiment in which the widths of all the bonding fingers BF are made large, the increase in the planar size of the package can be suppressed. However, in the case of the embodiment shown in FIG. 29, the length of the bonding finger group (length in Y direction shown in FIG. 29) becomes larger than that in the embodiment shown in FIG. 27, and thus the planar size of the package becomes larger.

Therefore, next, as shown in FIG. 30, an embodiment, in which the bonding fingers BF are arranged at plural rows in a so-called zigzag shape, was examined. In the case of the embodiment shown in FIG. 30, each width of the bonding fingers BF can be made larger, and thus the adhesion area of the ball part Bnd1 to the bonding finger BF becomes larger than that of the embodiment shown in FIG. 27. Furthermore, by arranging the bonding fingers BF in plural rows, the length of the bonding finger group can be made smaller, and thus the increase in the planar size of the package can be suppressed.

However, as shown in FIG. 30, in the case where the wire BWa is to be coupled to each of an arrangement Bd1 being a first row and an arrangement Bd2 being a second row by the stitch bonding system, there is such anxiety that a part of the wire BWa to be coupled to the arrangement Bd2 being the second row may come into contact with a part of the bonding finger BF arranged at the first row. Then, the smaller the separation distance between the bonding fingers BF arranged at plural rows is, the easier the wire BWa comes into contact with the bonding finger BF. In other words, in order to suppress the contact of the wire BWa with the bonding finger BF, it is necessary to increase the separation distance between the arrangement Bd1 being the first row and the arrangement Bd2 being the second row. As the result, also in the case of the embodiment shown in FIG. 30, the planar size of the package becomes larger.

The present inventors have found the embodiment shown in FIG. 7 on the basis of the above examination results. In the present embodiment, as shown in FIG. 7, in the bonding finger group in which many bonding fingers BF are arranged, the bonding fingers BF are formed across plural rows. First, in the arrangement Bd1 being the first row positioned relatively more close to the side S1 of the semiconductor chip 2 shown in FIG. 3, the bonding finger BF1 for stitch bonding is formed. In addition, in the arrangement Bd2 being the second row having a distance farther than the first row from the side S1 of the semiconductor chip 2 shown in FIG. 3, the bonding finger BF2 for ball bonding is formed. Furthermore, in the second row, the bonding finger BF1 for stitch bonding is not formed. In other words, in the present embodiment, the bonding finger BF1 for the normal bonding system is arranged at the first row relatively more close to the semiconductor chip 2 (see FIG. 3), and the bonding finger BF2 for the reverse bonding system is arranged at the second row having a distance farther than the first row from the semiconductor chip 2.

Moreover, in the bonding finger group having a relatively high arrangement density of the bonding fingers BF, the bonding finger BF1 in the first row to which the wire BWa is coupled in the normal bonding system forms a rectangle in plan view, and length L1 of the bonding finger BF1 in the extending direction is larger than the length in the direction orthogonal to the extending direction (width W1). In the example shown in FIG. 3, in bonding finger groups arranged along the sides S2, S3 and S4 among four sides constituting the outer edge of the semiconductor chip 2, the arrangement density of the bonding fingers BF is lower than that of the bonding finger group arranged along the side S1. Consequently, as is known by making a comparison between FIG. 7 and FIG. 8, the width W1 (length in direction orthogonal to extending direction) of the bonding finger BF1 in the first row shown in FIG. 7 is smaller than the width W3 of the bonding finger BF in a different bonding finger group shown in FIG. 8.

As described above, by setting the width W1 of the bonding finger BF1 formed in the region having a relatively high arrangement density of the bonding fingers BF to be smaller, even if many bonding fingers BF1 are arranged at the arrangement Bd1 shown in FIG. 7, the increase in the planar size of the package (in example shown in FIG. 7, increase in length in Y direction) can be suppressed.

Furthermore, in the present embodiment, the bonding fingers BF including the bonding finger BF1 and the bonding finger BF2 are arranged at one opening part SRp. For example, in the example shown in FIG. 3, one opening part SRp is formed for every bonding group constituted of the bonding fingers BF. In other words, in one bonding finger group, no solder resist film SR is arranged between adjacent bonding fingers BF. Thus, by configuring such that the bonding fingers BF are arranged at one opening part SRp, the distance between adjacent bonding fingers BF can be made shorter. As the result, even if many bonding fingers BF1 are arranged at the arrangement Bd1 shown in FIG. 7, the increase in the planar size of the package (in example shown in FIG. 7, increase in length in Y direction) can be suppressed. However, in a region with a room in the arrangement space of bonding fingers BF, a plurality of opening parts SRp may be provided for one bonding finger group. For example, in the example shown in FIG. 3, the opening parts SRp can be provided for the bonding finger group arranged along the side S2, side S3 or side S4 of the semiconductor chip 2.

When comparing the bonding finger BF1 in the first row with the bonding finger BF2 in the second row in the width direction, the width W1 of the bonding finger BF1 in the first row is smaller than the width W2 of the bonding finger BF2 in the second row (in FIG. 7, length in Y direction). In other words, the width W2 of the bonding finger BF2 is larger than the width W1 of the bonding finger BF1. For example, in the example shown in FIG. 7, the design dimension of the width W1 of the bonding finger BF1 is about 55 μm, whereas the design dimension of the width W2 of the bonding finger BF2 is about 80 μm. When explanation is given by applying to the example explained using FIG. 28, the width Wtp of the upper surface of the bonding finger BF1 (see FIG. 7) is about 40 μm, but the width Wtp of the upper surface of the bonding finger BF2 (see FIG. 7) is about 60 μm.

Consequently, as shown in FIG. 7 for example, even in the case where the width (diameter) of the ball part Bnd1 of the wire BWb is larger (thicker) than the width of the stitch part Bnd2 of the wire BWa (length in direction orthogonal to extending direction of wire BW), the entire lower surface of the ball part Bnd1 can be caused to adhere to the bonding finger BF2. For example, when the width of the ball part Bnd1 is less than 60 μm, the entire lower surface of the ball part Bnd1 can be caused to adhere to the upper surface of the bonding finger BF. That is, in the present embodiment, first, since the width of the bonding finger BF2 to which the ball part Bnd1 is to be coupled can be made sufficiently large, the adhesion area of the ball part Bnd1 to the bonding finger BF2 can be made large. As the result, the wire loop shape can be stabilized. Alternatively, the joining strength between the wire BW and the bonding finger BF can be enhanced.

In addition, in the present embodiment, the bonding finger BF2 for the reverse bonding system is arranged at a position different from the arrangement Bd1 being the first row, in which the bonding finger BF1 for normal bonding system is arranged (in example in FIG. 7, in arrangement Bd1 that does not overlap arrangement Bd2). Therefore, the length in the extending direction of the bonding finger group (Y direction in FIG. 7) can be reduced. Furthermore, as to the second row, the wire bonding by the normal bonding system is not performed. In the case of the reverse bonding system, the inclination angle of the wire BW relative to a target to be coupled on the first bond side can be brought close to 90 degrees. For example, in the vicinity of the bonding finger BF2 shown in FIG. 6, the inclination angle (about 90 degrees) of the wire BWb relative to the upper surface of the bonding finger BF2 is larger than the inclination angle (about 20 degrees) of the wire BWa relative to the upper surface of the bonding finger BF1, in the vicinity of the bonding finger BF1 shown in FIG. 5. Consequently, according to the present embodiment, even if the separation distance between the first row and the second row is made small, the wire BWb coupled to the bonding finger BF2 is difficult to make contact with the bonding finger BF1 in the first row. In other words, according to the present embodiment, the bonding finger BF1 in the first row and the bonding finger BF2 in the second row can be brought closer to each other. Even when the bonding fingers BF are arranged at plural rows, if the distance between respective rows is brought closer to each other in the way, the increase in the planar size of the package (increase in X direction shown in FIG. 7) can be suppressed.

Furthermore, as shown in FIG. 7, since the bonding finger BF2 is a terminal for ball bonding, the extension distance can be made smaller than that of the bonding finger BF1 for stick bonding. In the example shown in FIG. 7, for example, the planar shape of the bonding finger BF2 forms a circle. Accordingly, length L2 of the bonding finger BF2 in the extending direction is smaller (shorter) than the length of the bonding finger BF1 in the extending direction. Meanwhile, the length L2 of the bonding finger BF2 in the extending direction is, in plan view, the largest length of the bonding finger BF2 in the direction parallel to the extending direction of the wire BWa to be coupled to the bonding finger BF2. Therefore, when the planar shape of the bonding finger BF2 is circular as shown in FIG. 7, the length L2 is the same as the width W2. By reducing the length L2 of the bonding finger BF2, the increase in the planar size of the package (increase in length in X direction in example shown in FIG. 7) can be suppressed. Meanwhile, in the example shown in FIG. 7, an example, in which the whole of the arrangement Bd1 being the first row does not overlap the whole of the arrangement Bd2 being the second row, is shown, but as a modification, it is also possible to make these close to each other to the extent that a part of the arrangement Bd1 being the first row overlaps a part of the arrangement Bd2 being the second row. In other words, for example, a part of the bonding finger BF1 and a part of the bonding finger BF2 can be brought close to each other and be arranged to the extent that parts of these overlap in the Y direction.

<Method of Manufacturing Semiconductor Device>

Figure 9:
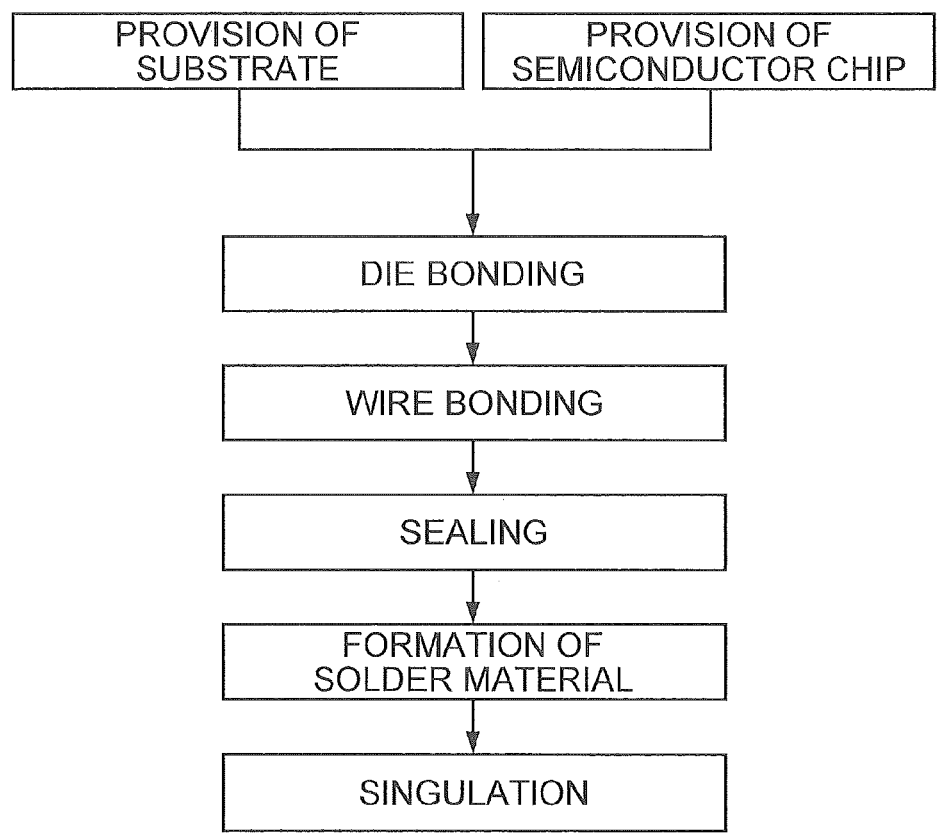
FIG. 9 is an explanatory diagram showing an assembling flow of the semiconductor device being an embodiment.

Next, a method of manufacturing the semiconductor device 1 explained using FIGS. 1 to 8 will be explained. The semiconductor device 1 of the present embodiment is manufactured along the assembling flow shown in FIG. 9. FIG. 9 is an explanatory diagram showing the assembling flow of the semiconductor device of the present embodiment.

1. Substrate Provision Process

Figure 10:
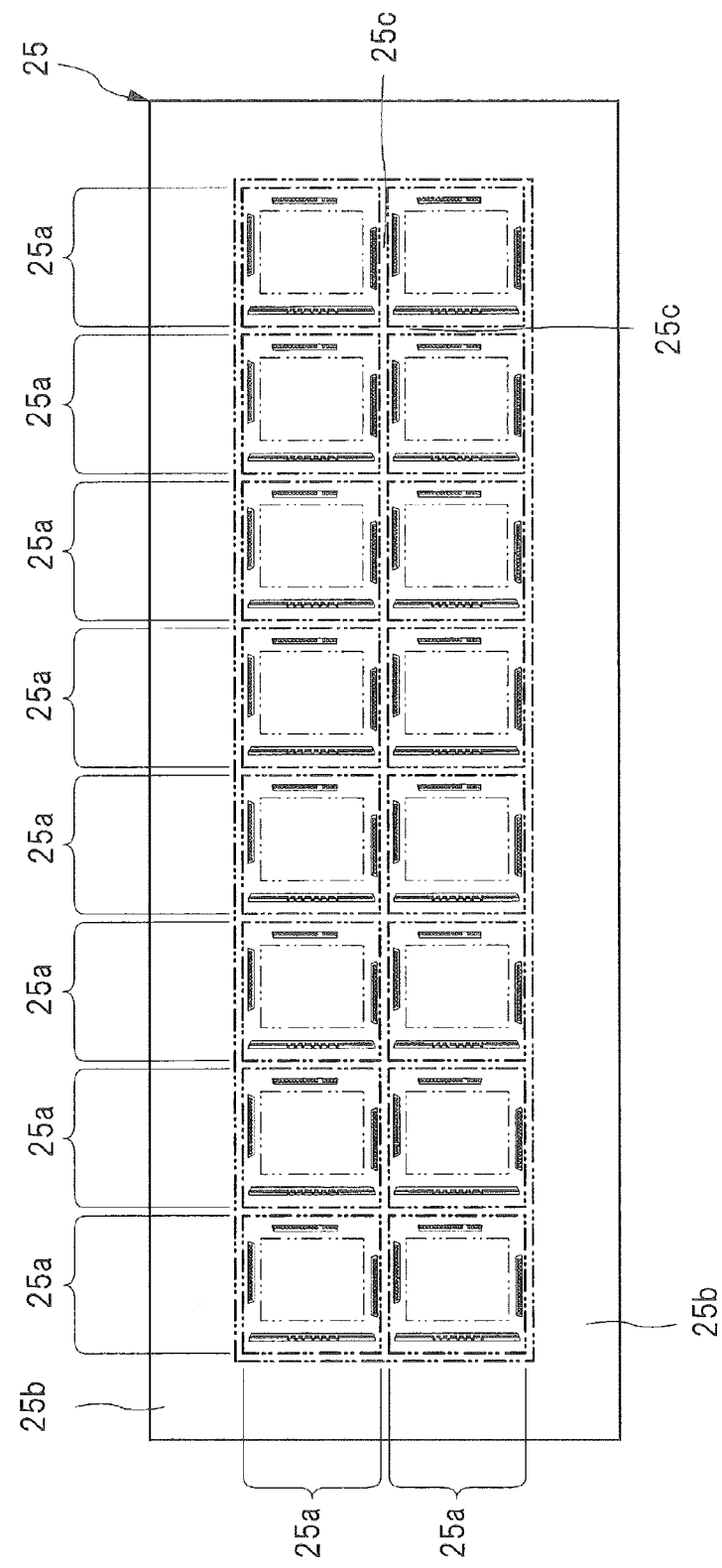
FIG. 10 is plan view showing the entire structure of the wiring substrate to be provided in a substrate provision process shown in FIG. 9.
Figure 11:
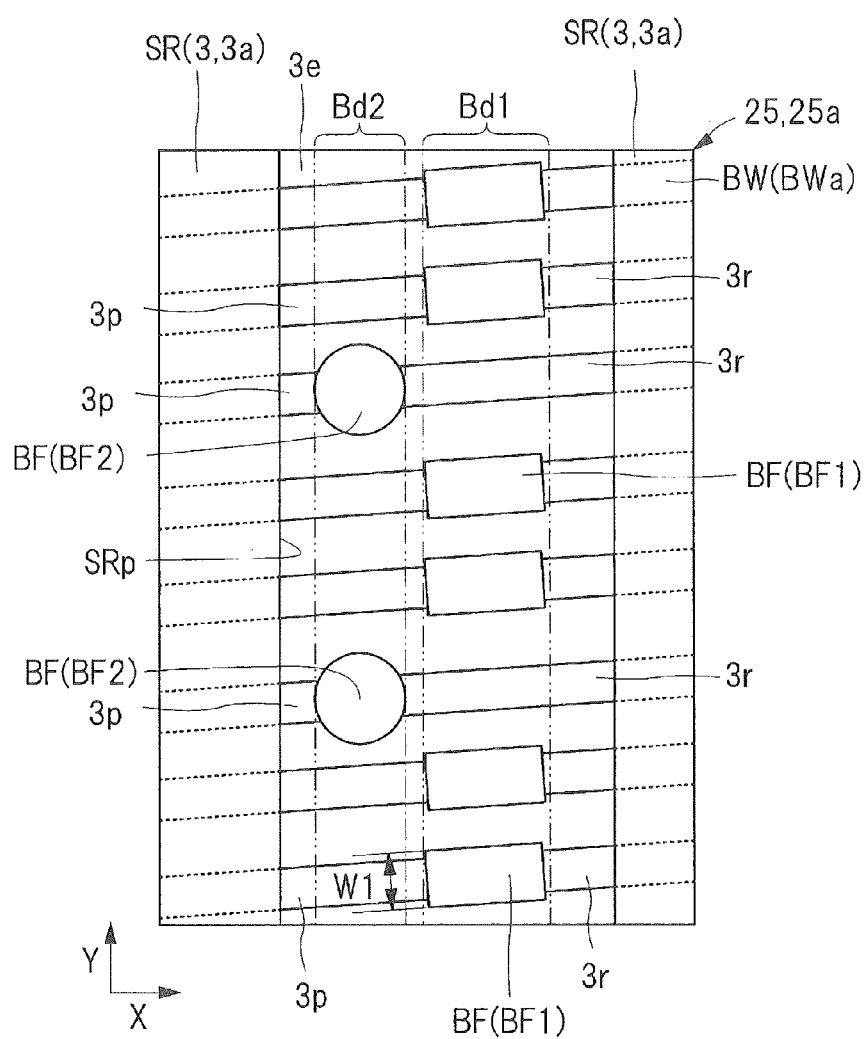
FIG. 11 is an enlarged plan view of a part corresponding to the region shown in FIG. 7 in one among a plurality of device-forming parts shown in FIG. 10.

First, in the substrate provision process shown in FIG. 9, a wiring substrate 25 as shown in FIG. 10 is provided. FIG. 10 is plan view showing the entire structure of the wiring substrate provided in the substrate provision process in FIG. 9. FIG. 11 is an enlarged plan view of a part corresponding to the region shown in FIG. 7 in one of a plurality of device-forming parts shown in FIG. 10.

The wiring substrate 25 provided in the present process includes, as shown in FIG. 10, a plurality of device-forming parts 25a inside a frame part 25b. In detail, the device-forming parts 25a are arranged in a line-column shape. The number of the device-forming parts 25a is not restricted to that in a mode shown in FIG. 10, and the wiring substrate 25 of the present embodiment includes, for example, sixteen device-forming parts 25a arranged in a line-column shape (2 lines×8 rows in FIG. 10). That is, the wiring substrate is a so-called multi-piece substrate having the device-forming parts 25a.

Furthermore, in the circumference of the respective device-forming parts 25a, a dicing part (dicing line) 25c, which is an intended region to cut the wiring substrate 25 in a sigulation process shown in FIG. 9, is arranged. As shown in FIG. 10, the dicing part 25c is arranged between adjacent device-forming parts 25a, and between the frame part 25b and the device-forming part 25a, so as to surround the respective device-forming parts 25a.

Each of the device-forming parts 25a corresponds to the wiring substrate 3 shown in FIGS. 3 and 4. Each of the device-forming parts 25a has the upper surface (chip-mounting surface) 3a, the bonding fingers (terminal, terminal on chip-mounting surface side, bonding lead) BF formed over the upper surface 3a, the lower surface (mounting surface) 3b on the side opposite to the upper surface 3a, and the lands (terminal, external terminal) LD formed over the lower surface 3b, shown in FIG. 4. The bonding fingers BF are electrically coupled to the lands LD shown in FIG. 4 via the wirings 3r formed in the respective device-forming parts 25a, respectively.

In addition, as shown in FIG. 11, the wiring 3r and a feeder wire 3p are coupled to each of the bonding fingers BF, over the upper surface 3a of the wiring substrate 25. Furthermore, the feeder wire 3p shown in FIG. 11 is a feeder wire for use in forming metal patterns such as the bonding finger BF and the wiring 3r by an electroplating method, and is formed so as to extend toward the dicing part 25c shown in FIG. 10. In the bonding finger BF, wiring 3r and feeder wire 3p, a plating film formed of, for example, nickel (Ni) is formed so as to cover the front surface of the base material having, for example, copper (Cu) as a main component.

Meanwhile, in the FIG. 11, the example in which the feeder wire 3p is coupled to each of the bonding fingers BF is shown, but as a modification, an embodiment in which the feeder wire 3p is coupled to a part of the bonding fingers BF and the feeder wire 3p is not coupled to the other part is also acceptable. Widths of the feeder wire 3p and the wiring 3r (length in the direction orthogonal to the extending direction) are smaller than the width W1 of the bonding finger BF1.

Details of the shape and layout of the bonding fingers BF shown in FIG. 11 have been explained earlier using FIG. 7, and thus overlapping explanation is omitted.

2. Provision Process of Semiconductor Chip

In the provision process of a semiconductor chip shown in FIG. 9, the semiconductor chips 2 shown in FIG. 4, that is, the analog chip FC and the controller chip CC are provided. In the present process, on a main surface side of, for example, a semiconductor wafer formed of silicon (illustration is omitted), there is provided the semiconductor wafer including a plurality of semiconductor elements and a wiring layer electrically coupled to these. An analog circuit is formed on the analog chip FC, and a control circuit controlling the analog circuit is formed on the controller chip CC.

As to the pad to which the wire BW is coupled by the reverse bonding system as shown in FIG. 6, it is preferable to form the bump electrode BMP over the pad PD, in the present process. As described above, in the present embodiment, since each of the pads PD of the controller chip CC to be mounted on the upper stage side is coupled to the wire BW by the reverse bonding system, the bump electrode BMP is to be formed on the pad PD of the controller chip CC.

After that, a dicing blade is caused to run along the dicing line of the semiconductor wafer (illustration is omitted) to cut the semiconductor wafer, and the analog chip FC and the controller chip CC shown in FIG. 4 are obtained in plural number, respectively. Meanwhile, the analog chip FC and the controller chip CC are obtained from, for example, different semiconductor wafers, respectively.

3. Die Bonding Process

Figure 12:
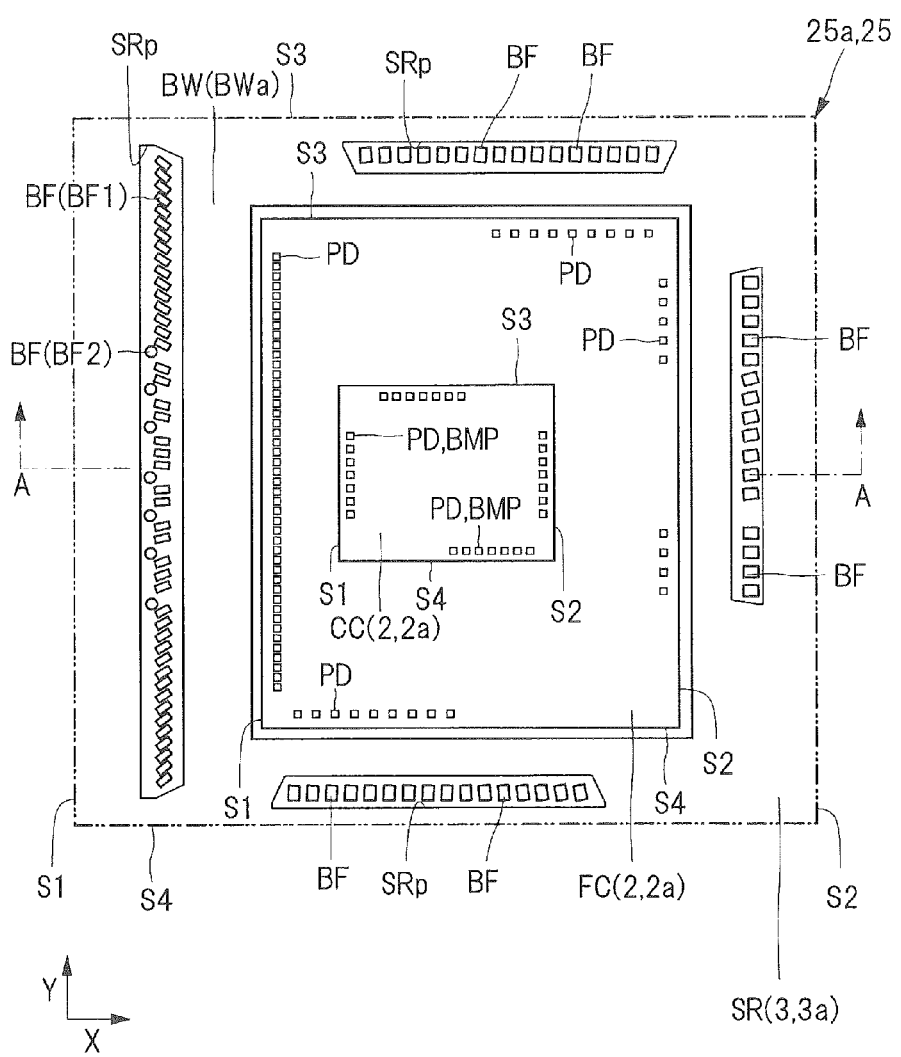
FIG. 12 is an enlarged plan view showing a state where a semiconductor chip is mounted over the wiring substrate shown in FIG. 10.
Figure 13:
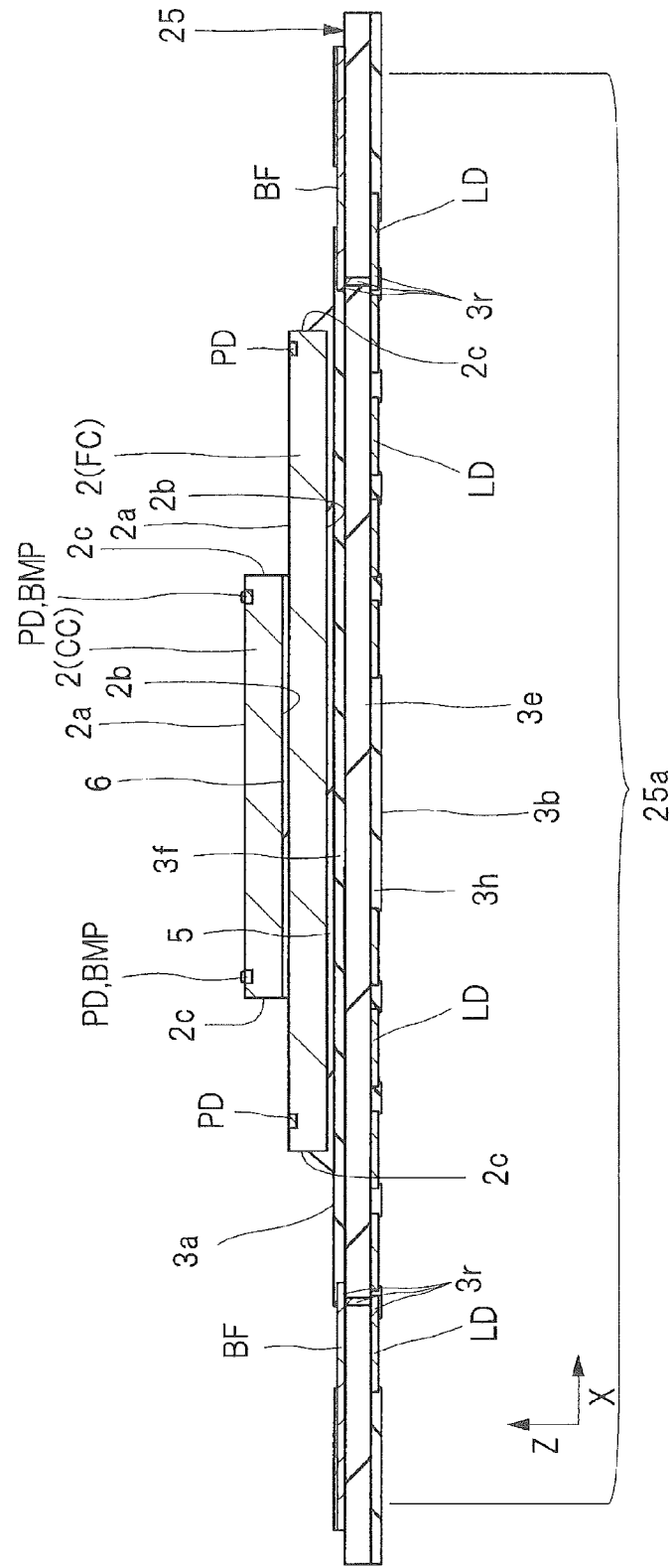
FIG. 13 is an enlarged cross-sectional view along an A-A line in FIG. 12.

Next, in a die bonding process shown in FIG. 9, as shown in FIGS. 12 and 13, the semiconductor chip 2 is mounted, bonded and fixed over the chip-mounting surface of the device-forming part 25a of the wiring substrate 25. FIG. 12 is an enlarged plan view showing a state where the semiconductor chip is mounted over the wiring substrate shown in FIG. 10, and FIG. 13 is an enlarged cross-sectional view along an A-A line in FIG. 12.

In the present embodiment, the semiconductor chips 2 are stacked over the chip-mounting surface of the wiring substrate 25. First, the analog chip FC to be arranged on the lower stage side is mounted (adhered and fixed) on the upper surfaces 3a of the respective device-forming parts 25a of the wiring substrate 25. The device-forming part 25a forms a tetragon in plan view and has the side S1, the side S2 on the side opposite to the side S1, the side S3 intersecting with the side S1 and side S2, and the side S4 on the side opposite to the side S3. Accordingly, in an example shown in FIG. 12, among bonding finger groups in which the bonding fingers BF are arranged, the bonding finger group arranged along the side S1 of the device-forming part 25a has a higher arrangement density of bonding fingers BF than other bonding finger groups.

In the present process, the semiconductor chip 2 is mounted such that the bonding finger BF faces the corresponding (in other words, intended to be electrically coupled) pad PD in plan view. Accordingly, in the present process, as shown in FIG. 12, the analog chip FC is arranged over the wiring substrate 25 such that the side S1 of the analog chip FC lies along the side S1 of the device-forming part 25a, the side S2 of the analog chip FC lies along the side S2 of the device-forming part 25a, the side S3 of the analog chip FC lies along the side S3 of the device-forming part 25a, and the side S4 of the analog chip FC lies along the side S4 of the device-forming part 25a.

Furthermore, in the present embodiment, as shown in FIG. 13, the analog chip FC is mounted by a so-called face-up mounting system, in which the chip is mounted over the wiring substrate 25 via the die bonding material (adhesive) 5 such that the rear surface 2b of the analog chip FC faces the upper surface 3a of the wiring substrate 25.

The die bonding material 5 is an adhesive that bonds and fixes the analog chip FC to the wiring substrate 25, and for example, has a paste-like property before curing. When mounting the analog chip FC using a paste-like adhesive, before mounting the semiconductor chip 2, the paste-like adhesive is previously arranged at the chip-mounting region of the device-forming part 25a. Then, after pressing the analog chip FC to the chip-mounting region to thereby spread out the paste-like adhesive, the adhesive is cured by, for example, heating and the analog chip FC is fixed. Meanwhile, as to the timing for curing completely the die bonding material 5, in addition to immediately after mounting the analog chip FC, the die bonding material 5 can also be cured with the die bonding material 6 after mounting the controller chip CC.

Next as shown in FIG. 12, the controller chip CC to be arranged on the upper stage side is mounted (bonded and fixed) over the front surface 2a of the analog chip FC. In the present process, the controller chip CC is arranged over the analog chip FC such that the side S1 of the controller chip CC lies along the side S1 of the device-forming part 25a, the side S2 of the controller chip CC lies along the side S2 of the device-forming part 25a, the side S3 of the controller chip CC lies along the side S3 of the device-forming part 25a, and the side S4 of the controller chip CC lies along the side S4 of the device-forming part 25a.

In the present embodiment, as shown in FIG. 13, the controller chip CC is mounted by the so-called face-up mounting system in which the chip is mounted over the analog chip FC via the die bonding material (adhesive) 6 such that the rear surface 2b of the controller chip CC faces the front surface 2a of the analog chip FC. The die bonding material 6 is, as described above, a film adhesive that bonds and fixes the semiconductor chips 2 to each other, and by, for example, curing a resin film referred to as DAF, or the like, the semiconductor chips 2 on the upper and lower stages are adhered and fixed. In this case, the die bonding material 6 being a tape material (film material) having an adhesive layer on both sides is stuck previously to the rear surface 2b of the controller chip CC, and the controller chip CC is caused to adhere via the tape material. After that, for example, by thermally curing a heat-curable resin component contained in the die bonding material 6, the controller chip CC is fixed.

4. Wire Bonding Process

Figure 14:
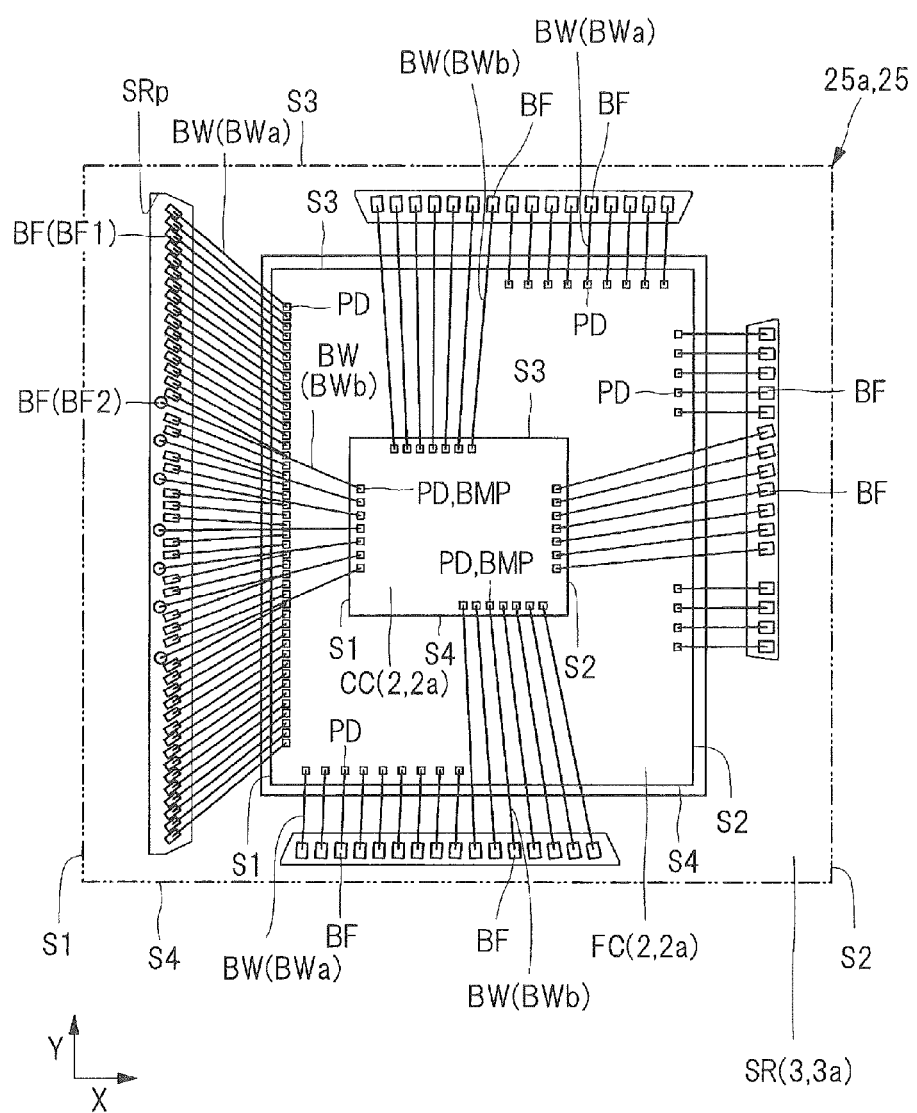
FIG. 14 is an enlarged plan view showing a state where the semiconductor chip and the wiring substrate shown in FIG. 12 are electrically coupled to each other by wire bonding.
Figure 15:
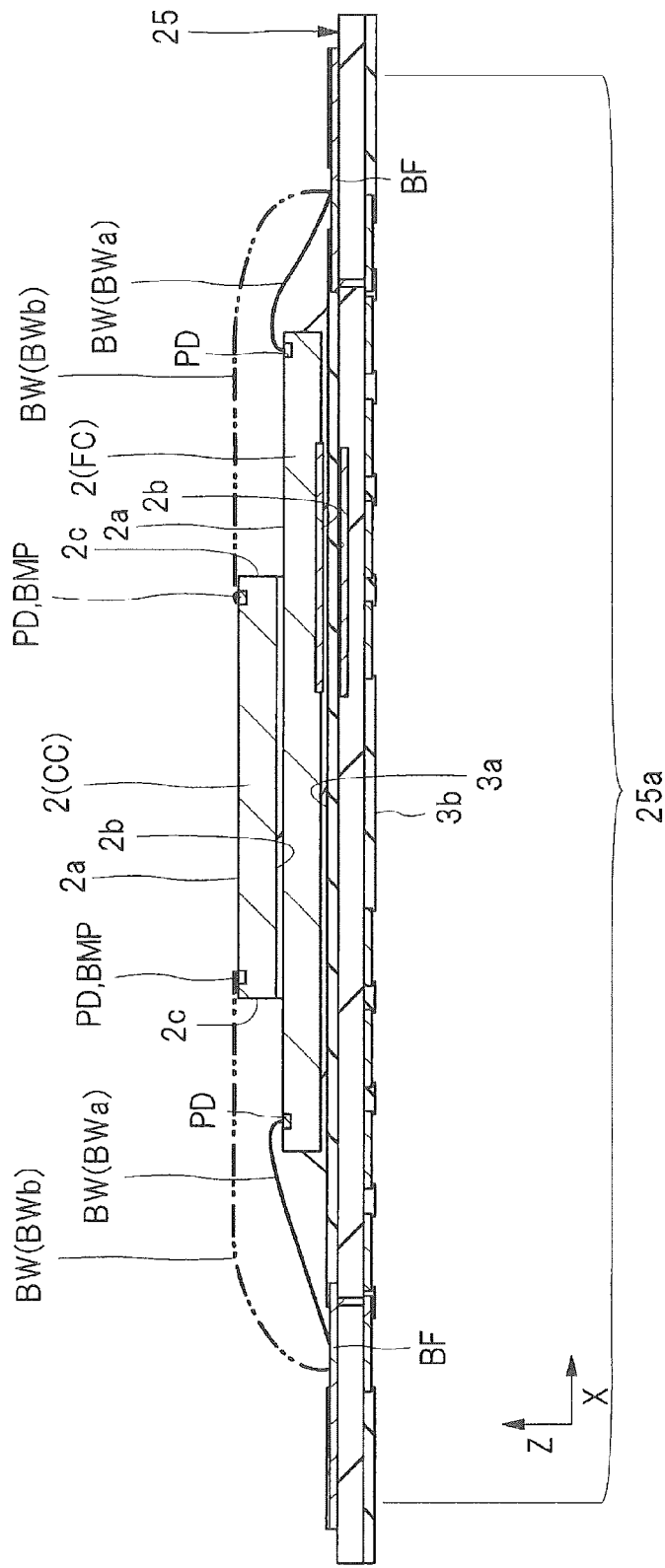
FIG. 15 is an enlarged cross-sectional view showing a state where the semiconductor chip and the wiring substrate shown in FIG. 13 are electrically coupled to each other by wire bonding.
Figure 16:
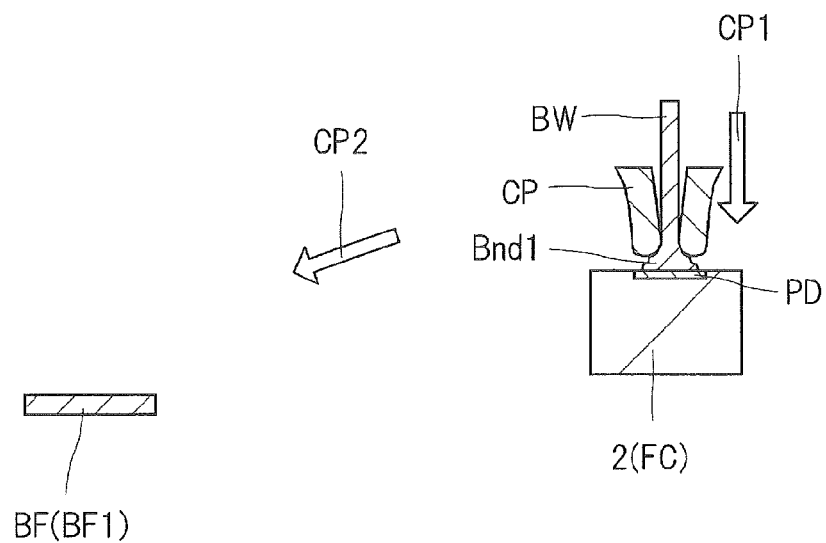
FIG. 16 is an enlarged cross-sectional view showing a state where a ball part is joined to a pad on a first bond side of a normal bonding system.
Figure 17:
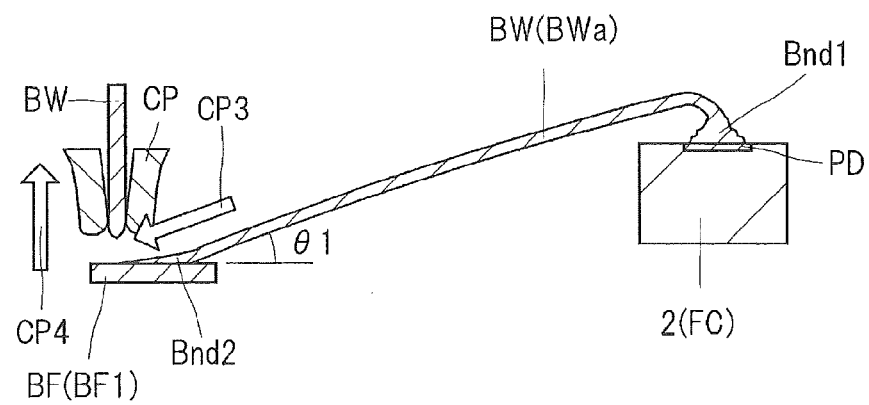
FIG. 17 is an enlarged cross-sectional view showing a state where a stitch part is joined to the bonding finger on a second bond side of the normal bonding system.
Figure 18:
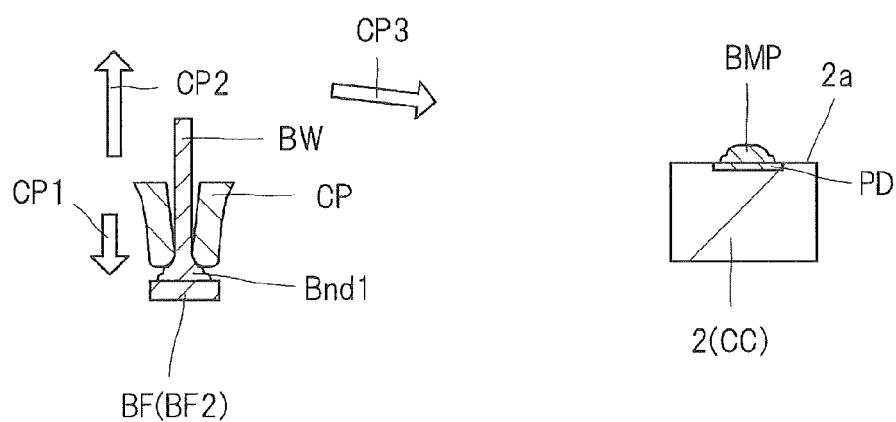
FIG. 18 is an enlarged cross-sectional view showing a state where the ball part is joined to the bonding finger on the first bond side of a reverse bonding system.
Figure 19:
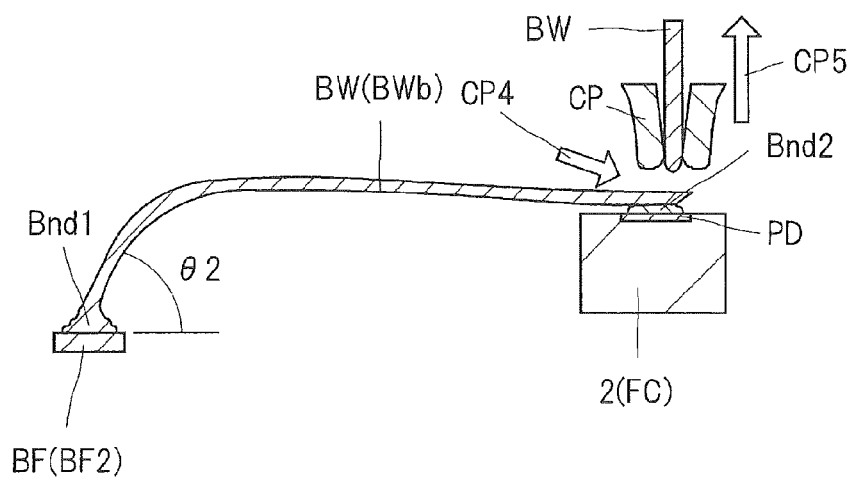
FIG. 19 is an enlarged cross-sectional view showing a state where the stitch part is joined to a bump electrode on the second bond side of the reverse bonding system.

Next, in a wire bonding process shown in FIG. 9, as shown in FIGS. 14 and 15, the pads PD of the semiconductor chip 2 are electrically coupled to the bonding fingers BF of the wiring substrate 25 via the wires BW, respectively. FIG. 14 is an enlarged plan view showing a state where each of the semiconductor chips and the wiring substrate shown in FIG. 12 are electrically coupled to each other by wire bonding, and FIG. 15 is an enlarged cross-sectional view showing a state where the semiconductor chip and the wiring substrate shown in FIG. 13 are electrically coupled to each other by wire bonding. Meanwhile, in FIG. 15, in order to show the difference in loop shapes of the wire BWa by the normal bonding system and the wire BWb by the reverse bonding system, the wire BWb is shown while attaching a two-dot chain line. The same applies to subsequent cross-sectional views. FIG. 16 is an enlarged cross-sectional view showing a state where a ball part is joined to a pad on a first bond side of a normal bonding system. FIG. 17 is an enlarged cross-sectional view showing a state where a stitch part is joined to the bonding finger on a second bond side of the normal bonding system. FIG. 18 is an enlarged cross-sectional view showing a state where the ball part is joined to the bonding finger on the first bond side of a reverse bonding system. FIG. 19 is an enlarged cross-sectional view showing a state where the stitch part is joined to a bump electrode on the second bond side of the reverse bonding system.

In the present process, as shown in FIGS. 14 and 15, a part of the bonding fingers BF formed on the device-forming part 25a of the wiring substrate 25 is electrically coupled to the pads PD formed over the front surface 2a of the analog chip FC via the wires BWa, respectively, by the normal bonding system. Furthermore, in the present process, the other part of the bonding fingers BF is electrically coupled to the pads PD (in detail, bump electrode BMP formed over pad PD) formed on the front surface 2a of the controller chip CC via the wires BWb, respectively, by the reverse bonding system.

In the case of the normal bonding system, as shown in FIG. 16, first, one end part of the wire BW is joined to the pad PD of the semiconductor chip 2 being the first bond side by the ball bonding system. In the ball bonding system, as shown with an arrow CP1 attached in FIG. 16, the ball part Bnd1 being a spherical metal lump formed at the chip of the wire BW is brought into contact with the pad PD, and by pressing with a capillary CP, the pad PD and the ball part Bnd1 are thermally pressure-bonded. At the time, in some cases, ultrasonic waves are applied from the capillary CP and the joining property of the pad PD and the ball part Bnd1 is enhanced. The ball part Bnd1 is formed in a spherical shape by performing discharge from an electric flame off not illustrated to the chip of the wire BW held by the capillary CP. Furthermore, by pressing the spherical ball part Bnd1 to the pad PD, the ball part Bnd1 is formed according to the shape of the chip of the capillary CP. In the present embodiment, the chip part on the first bond side is referred to as the ball part Bnd1, but since the ball part Bnd1 is formed as described above, the ball part Bnd1 has not always spherical shape in a state where it is coupled to a part to be coupled.

Next, as shown in FIG. 16 with an attached arrow CP2, while letting out the wire BW from the capillary CP, the capillary CP acts toward the bonding finger BF1 being the second bond side. In detail, before acting in the direction of the arrow CP2, the capillary CP acts over the pad PD (rise action), and after that, acts in the direction of going away from the bonding finger BF (reverse action). As the result of the rise action and reverse action of the capillary CP, as shown in FIG. 17, bending can be given easily to the vicinity of the first bond side of the wire BW.

Next, as shown in FIG. 17, the end part of the wire BW on the side opposite to the ball part Bnd1 is joined to the upper surface of the bonding finger BF by the stitch bonding system. In the stitch bonding system, as shown in FIG. 17 with an attached arrow CP3, a part of the wire BW is brought into contact with the bonding finger BF being the second bond side, and the capillary CP is moved in the extending direction of the bonding finger BF while pressing the wire BW to the bonding finger BF. As the result of the action of the capillary CP as described above, the wire BW is compressed and deformed plastically at the end part on the second bond side of the wire BW, and thus the stitch part Bnd2 is formed. Furthermore, at this time, the wire BW is cut at the stitch part Bnd2, and the wire BW held by the capillary CP is separated from the wire BW joined to the bonding finger BF.

Next, as shown in FIG. 17 through the use of an attached arrow CP4, the capillary acts toward over the bonding finger BF and moves to the subsequent wire bonding action. By above respective processes, the wire BWa by the normal bonding system is formed. On the second bond side of the wire BWa formed by the normal bonding system, the inclination angle θ1 of the wire BWa relative to the upper surface of the bonding finger BF1 is, for example, about 20 degrees. In the present embodiment, among the wires BW shown in FIG. 14, all the wires BW to be coupled to the analog chip FC on the lower stage side are formed by the normal bonding system.

On the other hand, in the case of the reverse bonding system, as shown in FIG. 18, first, one end part of the wire BW is joined to the bonding finger BF2 being the first bond side by the ball bonding system. Details of the ball bonding system are the same as the above ball bonding system explained using FIG. 16, except in that the pad PD being the object to be coupled is replaced with the bonding finger BF, and thus, overlapping explanation is omitted.

Next, as shown in FIG. 18 through the use of the attached arrow CP2, while letting out the wire BW from the capillary CP, the capillary CP acts toward the upper direction of the bonding finger BF (rise action). In the rise action in the reverse bonding system, the capillary CP is raised until the lower end of the capillary CP reaches a position higher than the height of the front surface 2a of the semiconductor chip 2. Accordingly, the rise amount becomes larger than that in the rise action explained in the normal bonding system. In the present embodiment, the rise amount of the capillary CP is larger than at least the sum of thicknesses of the analog chip FC and the controller chip CC shown in FIG. 15. By performing the rise action larger than that in the normal bonding system on the first bond side, the inclination angle θ2 of the wire BWb relative to the upper surface of the bonding finger BF1 shown in FIG. 19 is larger than the inclination angle θ1 shown in FIG. 17, and is, for example, about 80 degrees to 90 degrees.

Next, as shown in FIG. 18 through the use of the attached arrow CP3, while letting out the wire BW from the capillary CP, the capillary CP acts toward the pad PD of the semiconductor chip 2 being the second bond side. In detail, the capillary CP acts toward the direction going away from the pad PD (reverse action), and after that, acts toward the direction of the arrow CP3. As the result of the fact that the capillary CP performs the reverse action, as shown in FIG. 19, bending processing can easily be given over the first bond side of the wire BW.

Next, as shown in FIG. 19, the end part of a wire BWb on the side opposite to the ball part Bnd1 is joined to the bump electrode BMP formed over the pad PD by the stitch bonding system. In the stitch bonding system, as shown in FIG. 19 through the use of an attached arrow CP4, after bringing a part of the wire BWb into contact with the bump electrode BMP being the second bond side, while pressing the wire BW to the bonding finger BF with the capillary CP, it is moved along the extending direction of the bonding finger BF. By the action of the capillary CP, the stitch part Bnd2 is formed on the second bond side of the wire BW. Furthermore, at this time, the wire BW is cut at the stitch part Bnd2, and the wire BW held by the capillary CP is separated from the wire BW joined to the bump electrode BMP. However, in the case of the reverse bonding system, the stitch part Bnd2 is joined over the semiconductor chip 2. Therefore, it is necessary to set the external force to be applied when forming the stitch part Bnd2 in the range that can suppress the damage of circuit elements formed over the semiconductor chip 2.

Next, as shown in FIG. 19 with an attached arrow CP5, the capillary rises over the pad PD, and proceeds to the subsequent wire bonding action. By above respective processes, the wire BWb by the reverse bonding system is formed. On the first bond side of the wire BWb formed by the reverse bonding system, the inclination angle θ2 of the wire BWb relative to the upper surface of the bonding finger BF2 is, for example, about 80 degrees to 90 degrees. In the present embodiment, among the wires BW shown in FIG. 14, all the wires BW to be coupled to the controller chip CC on the upper stage side are formed by the reverse bonding system.

As explained using FIG. 7, in the present embodiment, to the bonding finger BF1 of the arrangement Bd1 being the first row lying relatively inner side (on semiconductor chip 2 side shown in FIG. 14), the stitch part Bnd2 is coupled by the normal bonding system. On the other hand, to the bonding finger BF2 of the arrangement Bd2 being the second row positioned on the outer side of the first row (on peripheral part side of the device-forming part 25a shown in FIG. 14), the ball part Bnd1 is coupled by the reverse bonding system. Accordingly, in the present process, it is preferable to couple the wire BWa to each of the bonding fingers BF1 arranged on the relatively inner side, and after that, to form the wire BWb for the bonding finger BF2 arranged on the outer side.

However, in the case of the bonding finger group where the bonding fingers BF are arranged at one row as shown in FIG. 8, either of the wire BWa and the wire BWb may be formed earlier.

5. Sealing Process

Figure 20:
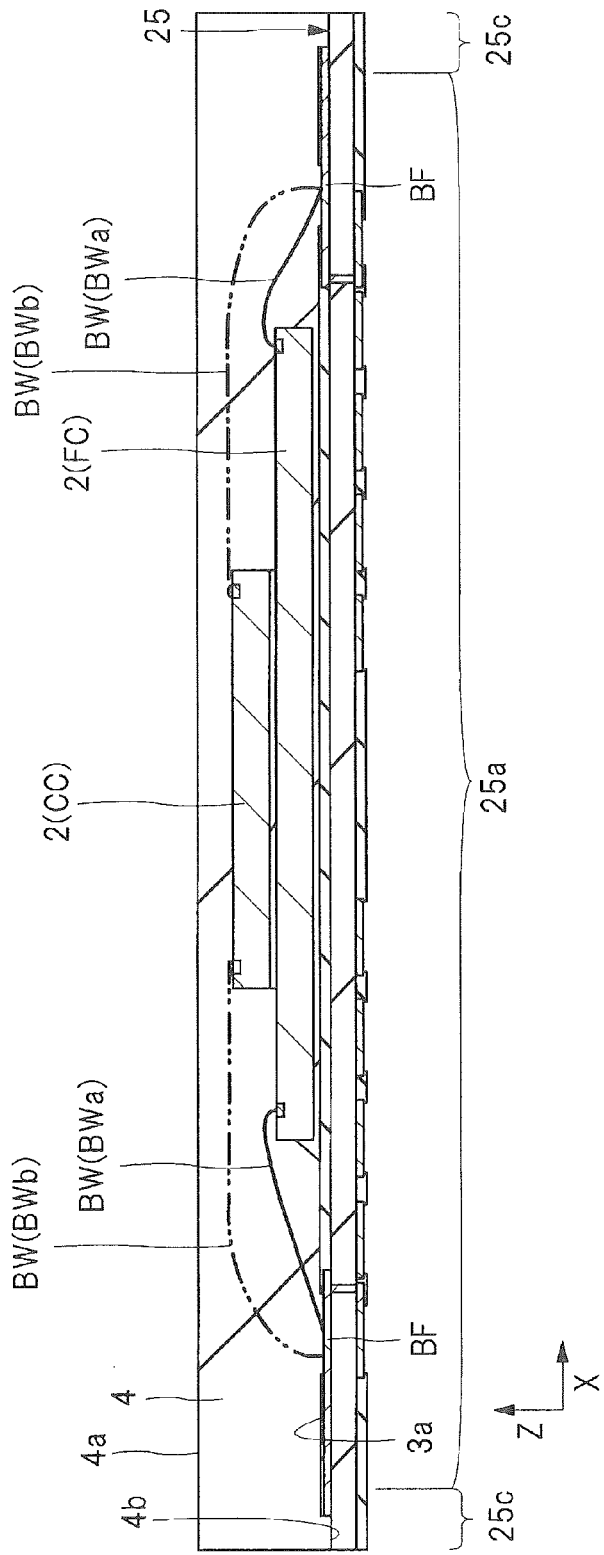
FIG. 20 is an enlarged cross-sectional view showing a state where the semiconductor chip and the wires shown in FIG. 15 are sealed with resin.

Next, in the sealing process shown in FIG. 9, the semiconductor chip 2 and the wires BW are sealed with resin, as shown in FIG. 20. FIG. 20 is an enlarged cross-sectional view showing a state where the semiconductor chip and the wires shown in FIG. 15 are sealed with resin.

In the present process, the wiring substrate 25 is arranged in a molding die provided with a cavity, which is not illustrated, and a sealing body 4 is formed by a so-called transfer mold system, in which, after sealing the upper surface 3a side of the wiring substrate 25 with resin, the sealing body 4 is formed by curing the resin.

In addition, in an example shown in FIG. 20, an example of forming the sealing body 4 by applying a system of so-called MAP (Mold Allay Process) is shown, in which the device-forming parts 25a are covered collectively and resin-sealed with one cavity of a molding die. In the case of the MAP system, since the sealing body 4 integrated so as to cover the device-forming parts 25a is formed, the upside of the dicing part 25c is also covered with the sealing body 4.

6. Process of Forming Solder Material

Figure 21:
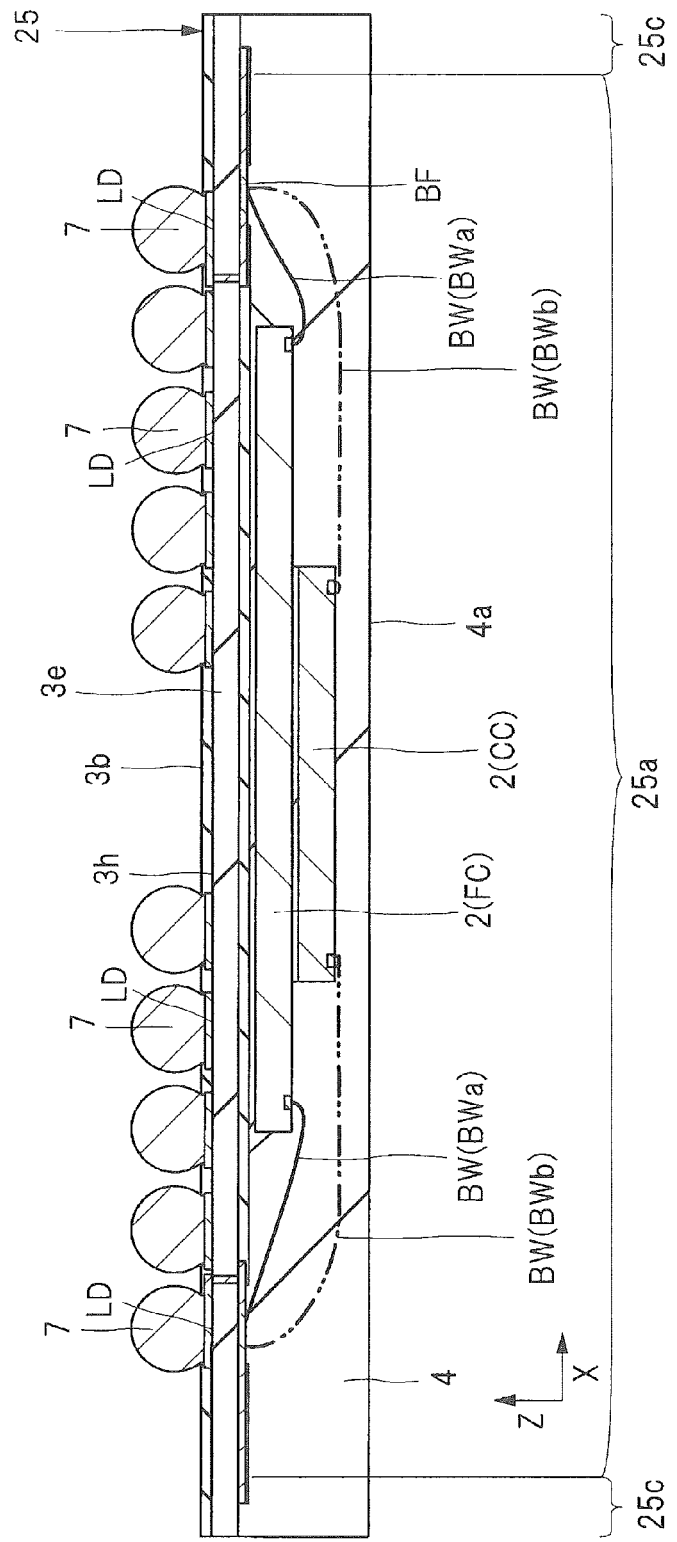
FIG. 21 is an enlarged cross-sectional view showing a state where solder is formed over each of exposed surfaces of a plurality of lands shown in FIG. 20.

Next, in a process of forming a solder material shown in FIG. 9, the solder material 7 is formed so as to cover each of the exposed surfaces of the lands LD, as shown in FIG. 21. FIG. 21 is an enlarged cross-sectional view showing a state where solder is formed on each of exposed surfaces of the lands shown in FIG. 20.

In the present process, the solder material 7 is formed on each of the exposed surfaces of the lands LD exposed on the lower surface 3b side of the wiring substrate 25. In the case where the solder material 7 in a ball shape is to be formed as shown in FIG. 21, the top/bottom of the wiring substrate 25 is reversed, and, in a state where the lower surface 3b is arranged so as to face upward, solder in a spherical shape is arranged over the land LD. Next, by heating and melting the spherical solder, and then by cooling it, a plurality of solder materials 7 is joined to the exposed surfaces of the lands LD, respectively. A cooling treatment of solder after heating and melting of the same is referred to as a reflow treatment.

In the present embodiment, as an example, an embodiment of forming the solder material 7 in a ball shape is shown, but there are various modifications for the mode of the external terminal of the semiconductor device. For example, by a plating method, or by giving the reflow treatment after coating paste-like solder, a solder material thinner than the solder material 7 shown in FIG. 21 can be formed. Further, for example, in the case of a modification in which no solder material 7 is formed, the process can be omitted.

7. Singulation Process

Figure 22:
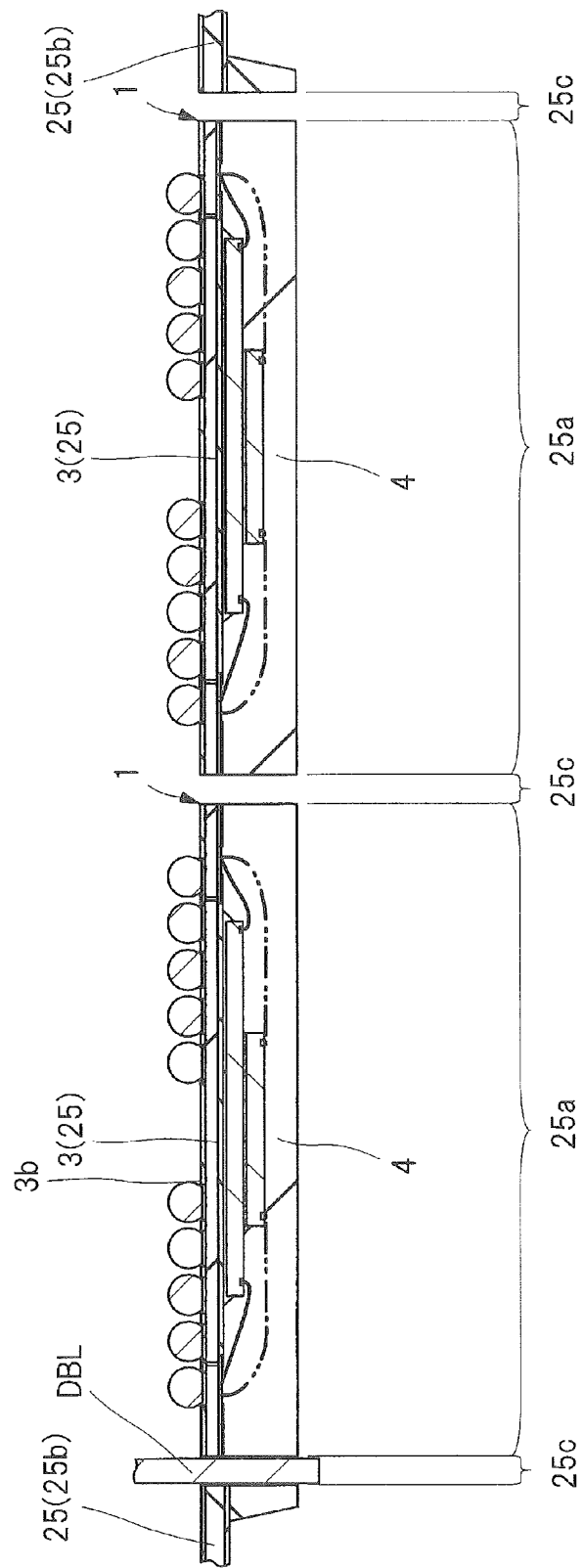
FIG. 22 is an enlarged cross-sectional view showing a state where the wiring substrate shown in FIG. 21 has been cut with a dicing blade.

Next, in a singulation process shown in FIG. 9, division is performed for every device-forming part 25a of the wiring substrate 25 to obtain a plurality of semiconductor devices 1, as shown in FIG. 22. FIG. 22 is an enlarged cross-sectional view showing a state where the wiring substrate shown in FIG. 21 has been cut with a dicing blade.

In the present process, as shown in FIG. 22, a dicing blade (rotatable blade) DBL is run along the dicing part (dicing line) 25c to cut (separate) the wiring substrate 25 and the sealing body 4, and the wiring substrate 25 is singulated for every device-forming part 25a. Consequently, the device-forming parts 25a are cut off from the adjacent device-forming parts 25a and frame part 25b, respectively, and the semiconductor devices 1 are obtained. Meanwhile, in detail, after the process, necessary examinations and tests such as an appearance check and electric test are performed, and those having passed these serve as the semiconductor device 1 being the end product explained using FIGS. 1 to 8. Then, the semiconductor device 1 is shipped or mounted on a mounting substrate not illustrated.

<Modification>

Hereinbefore, the invention achieved by the present inventors has been explained specifically on the basis of the embodiment, but it is needless to say that the present invention is not restricted to the embodiment, and that it may be changed variously in the range that does not deviate from the gist thereof.

(Modification 1)

Figure 23:
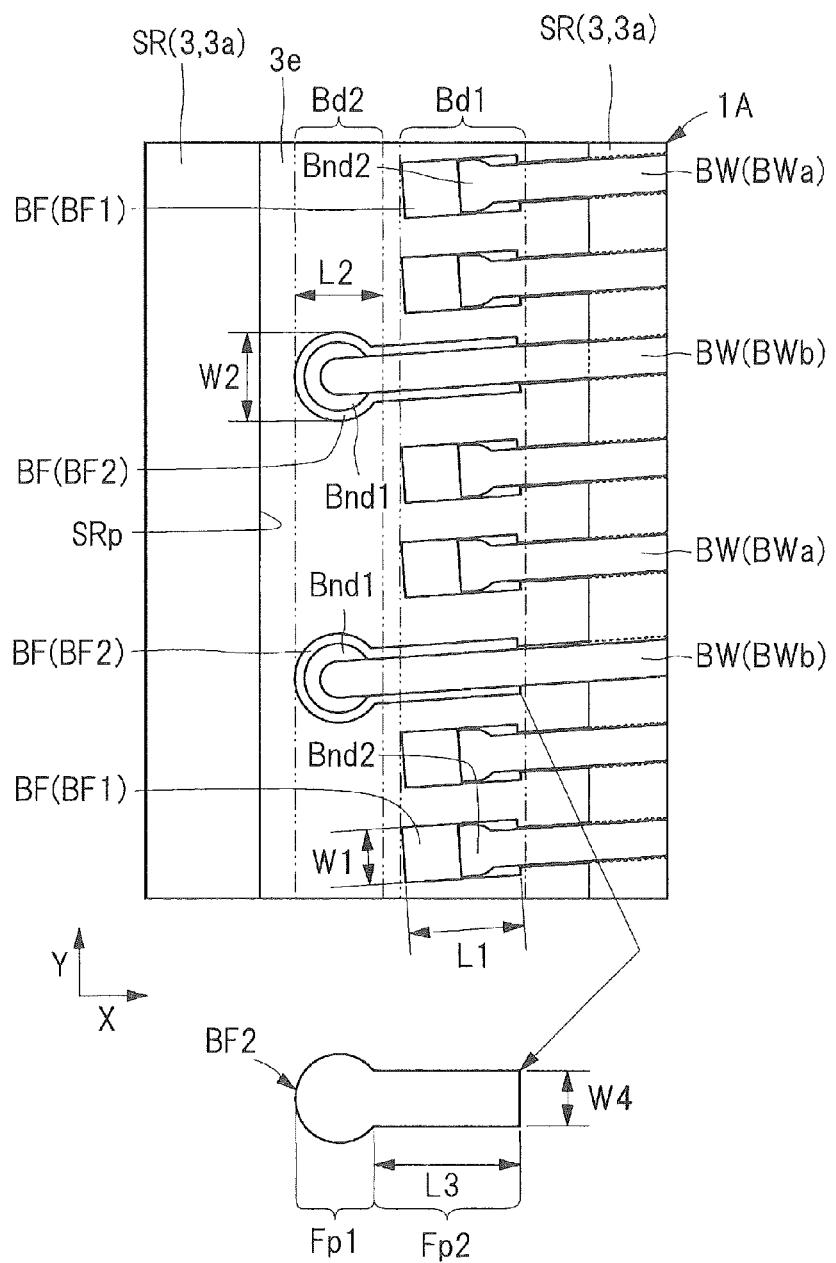
FIG. 23 is an enlarged plan view showing a modification to FIG. 7.

In the example shown in FIG. 7, among the bonding fingers BF, the bonding finger BF2 for the ball bonding system has a circular planar shape. When making the planar shape of the bonding finger BF2 circular, the adhesion area to the ball part Bnd1 can be maximized and occupation area of the bonding finger BF2 can be minimized. However, as to the planar shape of the bonding finger BF2, there are various modifications such as a tetragon, a pentagon, a polygon, or the like. The bonding finger BF2 owned by a semiconductor device 1A of a modification shown in FIG. 23 has a circular part Fp1 having a circular planar shape and an extending part Fp2 that is linked to the circular part Fp1 and extends along the extending direction of the wire BW. FIG. 23 is an enlarged plan view showing a modification to FIG. 7.

The circular part Fp1 of the bonding finger BF2 the semiconductor device 1A has, shown in FIG. 23 corresponds to the bonding finger BF2 the semiconductor device 1 has, in FIG. 7. That is, the circular part Fp1 shown in FIG. 23 is provided in a position different from over the arrangement Bd1 in which the bonding fingers BF1 are arranged (in FIG. 23, to arrangement Bd2). The width W2 of circular part Fp1 is larger than the width W1 of the bonding finger BF1, and for example, the design dimension is about 80 µm. Accordingly, when coupling the ball part Bnd1 at the center of the circular part Fp1, the adhesion area of the ball part Bnd1 to the circular part Fp1 can be maximized.

The shape and layout of the extending part Fp2 of the bonding finger BF2 the semiconductor device 1A has, shown in FIG. 23 corresponds to the bonding finger BF1 arranged adjacent to the bonding finger BF2. That is, the extending part Fp2 shown in FIG. 23 is provided over the arrangement Bd1 in which the bonding fingers BF1 are arranged. The width of the extending part Fp2 (length in direction orthogonal to extending direction) W4 is formed with the same design dimension as the width W1 of the bonding finger BF1. The length L3 in the extending direction of the extending part Fp2 is longer than the length L1 in the extending direction of the bonding finger BF1.

That is, the shape of the bonding finger BF2 the semiconductor device 1A has, shown in FIG. 23 is a shape in which the circular part Fp1 corresponding to the bonding finger BF2 the semiconductor device 1 has, shown in FIG. 7 and the extending part Fp2 corresponding to the bonding finger BF1 are formed integrally. In the case of the modification, to the bonding finger BF2, when the wire BW is to be coupled by the reverse bonding system, the ball part Bnd1 of the wire BW can be coupled to the circular part Fp1, and when the wire BW is to be coupled by the normal bonding system, the stitch part Bnd2 of the wire BW can be coupled to the extending part Fp2. That is, the versatility of the wiring substrate 3 can be enhanced.

Further, although illustration is omitted, a further modification to FIG. 23 can be an embodiment in which the ball part Bnd1 of the wire BWb is coupled to the circular part Fp1 and the stitch part Bnd2 of the wire BWa is coupled to the extending part Fp2. In this case, since the transmission distance between the controller chip CC on the upper stage side and the analog chip FC on the lower stage side, for example, shown in FIG. 4 can be reduced, the electric characteristics is enhanced.

However, in the case of the modification shown in FIG. 23, a space for arranging the extending part of the bonding finger BF2 becomes necessary between neighboring bonding fingers BF1. Therefore, from the viewpoint of shortening the length of the package in the Y direction shown in FIG. 23, the embodiment shown in FIG. 7 is more preferable.

(Modification 2)

Figure 24:
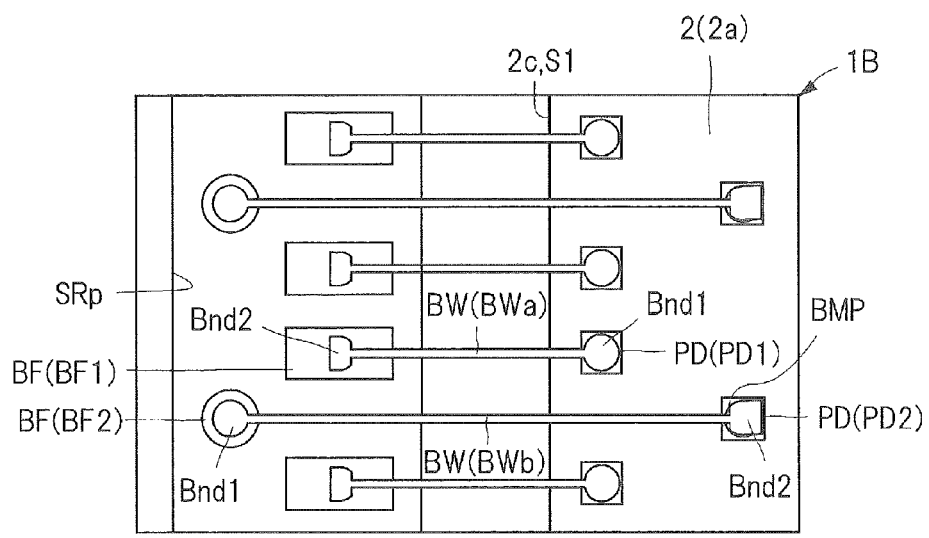
FIG. 24 is an enlarged plan view showing schematically the coupling relationship between a plurality of pads owned by the semiconductor chip and a plurality of bonding fingers of the wiring substrate in a modification to the semiconductor device shown in FIG. 3.
Figure 25:
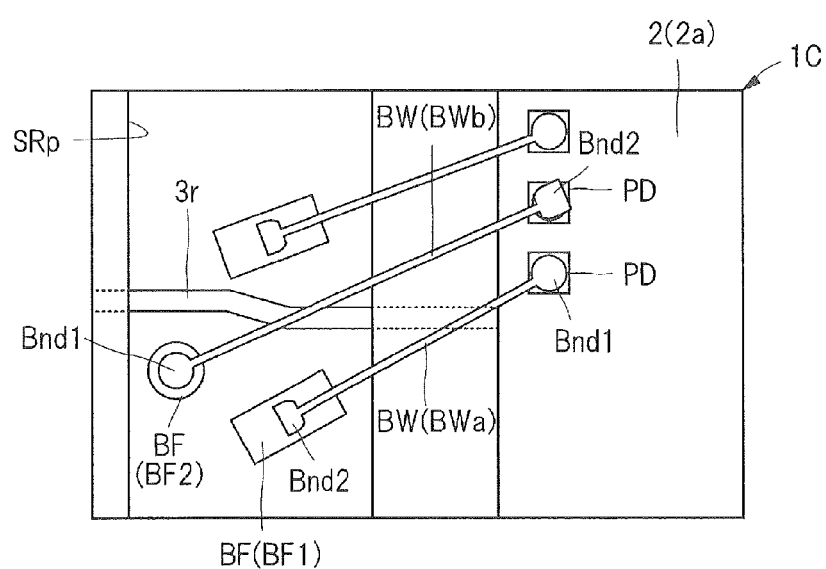
FIG. 25 is an enlarged plan view showing a modification to FIG. 24.
Figure 26:
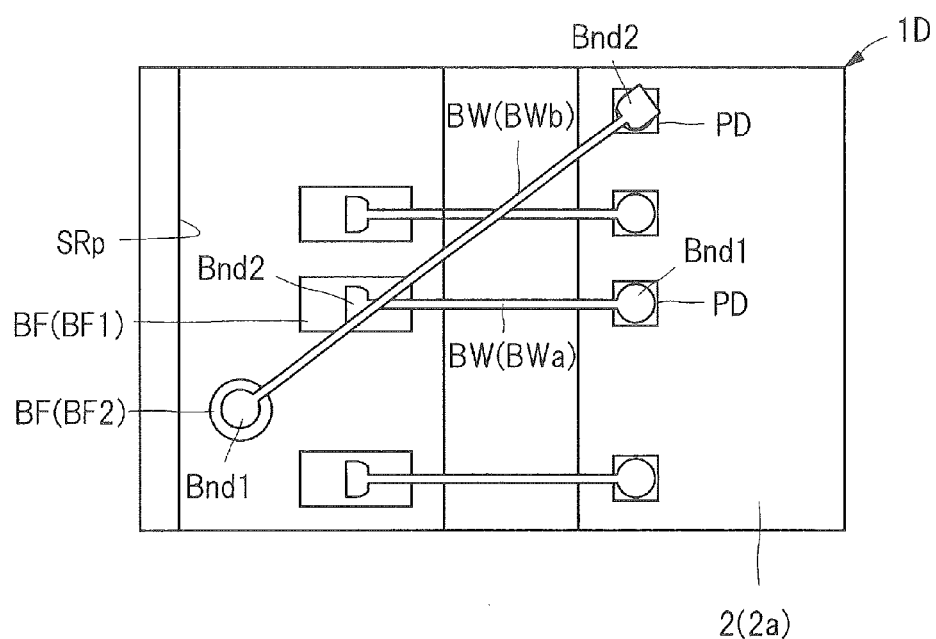
FIG. 26 is an enlarged plan view showing another modification to FIG. 24.

Further, as the example that, for example, the wire BWa formed by the normal bonding system and the wire BWb formed by the reverse bonding system coexist in one package, the embodiment in which the semiconductor chips 2 are stacked was explained. However, even in the case where the semiconductor chip 2 arranged in a package is only one, there is such a case that the wire BWa formed by the normal bonding system and the wire BWb formed by the reverse bonding system are caused to coexist in one package. FIG. 24 is an enlarged plan view showing schematically the coupling relationship between the pads the semiconductor chip has and the bonding fingers of the wiring substrate in a modification to the semiconductor device shown in FIG. 3. FIG. 25 is an enlarged plan view showing a modification to FIG. 24. FIG. 26 is an enlarged plan view showing another modification to FIG. 24.

A semiconductor device 1B shown in FIG. 24, a semiconductor device 1C shown in FIG. 25 and a semiconductor device 1D shown in FIG. 26 are common in that they have one built-in semiconductor chip 2 in one package and have the wire BWa of the normal bonding system and the wire BWb of the reverse bonding system.

First, the semiconductor device 1B shown in FIG. 24 is different from the embodiment in that the pads PD of the semiconductor chip 2 are arranged at plural rows. In detail, the semiconductor chip 2 shown in FIG. 24 has a plurality of pads PD arranged along the side S1. The pads PD includes a pad PD1 provided in a position relatively more close to the side surface 2c (in other words, side S1), and a pad PD2 provided in a position with a distance from the side surface 2c (in other words, side S1) larger than that of the pad PD1.

In the case where the wire BW is to be coupled to a pad PD having longer distance to the side surface 2c of the semiconductor chip 2 as the pad PD2, when the normal bonding system is applied, an anxiety is generated that the wire BW may contact to the peripheral part of the semiconductor chip 2. In other words, in order to prevent the wire BW from making contact with the peripheral part of the semiconductor chip 2, it is necessary to make the loop shape formed by the normal bonding system larger, which leads to a larger thickness and planar size. Here, in the case of the reverse bonding system, there is such an advantage that the wire BW contacts hardly with the peripheral part of the semiconductor chip 2, as compared with the normal bonding system. Accordingly, in the case where such an anxiety exists that the wire BW may contact with the peripheral part of the semiconductor chip 2, the adoption of the reverse bonding system is preferable. For example, in plan view, when a part having a length of one quarter or more of the entire length of the wire BW overlaps the semiconductor chip 2 in the thickness direction, the application of the reverse bonding system is preferable. On the other hand, the normal bonding system has a better operating efficiency than the reverse bonding system, and, therefore, preferably the pad PD1, for which the probability of the contact between the wire BW and the semiconductor chip 2 is low, is coupled by the normal bonding system. Further, in the case of the normal bonding system, the width of the bonding finger BF can be made narrower than the case of the reverse bonding system. Therefore, from the viewpoint of improving the arrangement density of the bonding fingers BF, the normal bonding system is more advantageous.

Accordingly, even in an embodiment in which the semiconductor chips 2 are not stacked, the application of the technology explained in the embodiment is preferable when the wires BW to be coupled to the semiconductor chip 2 include the wire BWa coupled by the normal bonding system and the wire BWb coupled by the reverse bonding system.

Next, the semiconductor device 1C shown in FIG. 25 is different from the semiconductor device 1B shown in FIG. 24, in that, in plan view, the wire BWb is provided so as to stretch over the wiring 3r for another signal (or for applying potential) in a position overlapping an opening part SRp. To the wiring 3r for another signal shown in FIG. 25, a current, which is different from the current flowed to the wire BWb, is flowed. When increasing the number of the bonding fingers BF, the layout of the wiring 3r to be coupled to the bonding finger BF tends to be complicated. Consequently, depending on the layout of the wiring 3r, as shown in FIG. 25, the wire BW is provided so as to stretch over the wiring 3r for another signal in some cases. Further, as described above, since the arrangement density of the bonding fingers BF can be enhanced by providing the bonding fingers BF in one opening part SRp, as shown in FIG. 25, there is such a case that the wire BW is arranged so as to stretch over the wiring 3r for another signal in a position overlapping the opening part SRp. In this case, when coupling the wire BW stretching over the wiring 3r by the normal bonding system, there is such an anxiety that the wiring 3r makes contact with the wire BW. Accordingly, as shown in FIG. 25, preferably the wire BW stretching over the wiring 3r for another signal is coupled by the reverse bonding system.

Consequently, the wires BW owned by the semiconductor device 1C include the wire BWa coupled by the normal bonding system and the wire BWb coupled by the reverse bonding system. Accordingly, also in the case of the semiconductor device 1C, the application of the technology explained in the above embodiment is preferable.

Next, the semiconductor device 1D shown in FIG. 26 is different from the semiconductor device 1B shown in FIG. 24, in that, in plan view, the wire BWb is provided so as to stretch over the other wire BWa. When a circuit becomes complicated in accordance with higher functionality of the semiconductor chip 2, as shown in FIG. 26, in plan view, there is also such a case that a part of the wires BW intersects with the other wire BW. In this case, by coupling the wire BW on one side by the reverse bonding system, the contact of the wires BW with each other can be suppressed.

Consequently, the wires BW the semiconductor device 1D has, include the wire BWa coupled by the normal bonding system and the wire BWb coupled by the reverse bonding system. Accordingly, also in the case of the semiconductor device 1D, the application of the technology explained in the embodiment is preferable.

(Modification 3)

In the embodiment, for example, the embodiment, in which the arrangement density of the bonding fingers BF becomes high in a part of bonding finger groups among groups of the bonding fingers arranged along four sides of the semiconductor chip 2, was explained. However, a modification can be applied also to the case where the arrangement density of the bonding fingers BF is high for each of bonding finger groups arranged along four sides of the semiconductor chip 2. In the case where the arrangement density of the bonding fingers BF is high in groups of the bonding fingers, and the wire BWa of the normal bonding system and the wire BWb of the reverse bonding system coexist, it is preferable to apply the technology explained in the embodiment to each of the groups of the bonding fingers.

(Modification 4)

In the above embodiment, for example, as shown in FIG. 7, the embodiment in which a plurality of bonding fingers BF1 and a plurality of bonding fingers BF2 are provided in one bonding finger group was explained, but the technology can also be applied to the case where the bonding finger BF2 to be coupled by the reverse bonding system is one.

(Modification 5)

In the embodiment, for example, the bonding finger BF1 is arranged at the arrangement Bd1 being the first row having relatively nearer distance to the semiconductor chip 2, and the bonding finger BF2 is arranged at the arrangement Bd2 being the second row having farther distance up to the semiconductor chip 2 as compared with the arrangement Bd1. However, as a modification, the bonding finger BF2 for reverse bonding can also be arranged at a position more close to the semiconductor chip 2 as compared with the bonding finger BF1. In the case of the reverse bonding system, since a part of the wire BW is formed so as to extend over the bonding finger BF, as compared with the case of the normal bonding system, the position of the bonding finger BF can be brought more close to the semiconductor chip 2. Accordingly, when bringing the bonding finger BF2 for reverse bonding more close to the semiconductor chip 2, the separation distance between the bonding finger BF2 and the bonding finger BF1 can be made larger. As the result, the contact of the wire BWa coupled to the bonding finger BF1 with the bonding finger BF2 for reverse bonding can be suppressed. Further, by bringing the bonding finger BF2 more close to the semiconductor chip 2, the increase in the distance from the bonding finger BF1 to the semiconductor chip 2 can be suppressed, and, therefore, the increase in the planar size can also be suppressed.

(Modification 6)

Furthermore, modifications themselves can be combined and applied in the range that does not deviate from the gist of the technical idea explained in the embodiment.

What is claimed is:

1. A semiconductor device comprising:
   a wiring substrate having a chip-mounting surface, a plurality of terminals formed on the chip-mounting surface, and a mounting surface opposite to the chip-mounting surface;
   a first semiconductor chip having a first main surface, a plurality of first electrodes formed over the first main surface and a first rear surface opposite to the first main surface, and mounted over the chip-mounting surface such that the first rear surface faces the chip-mounting surface of the wiring substrate; and
   a plurality of wires each having a ball part and a stitch part, and coupled to the plurality of terminals respectively,
   wherein:
   the plurality of wires have a plurality of first wires and a second wire;
   in plan view, the plurality of terminals are arranged along a side of the first main surface of the first semiconductor chip in series;
   the plurality of terminals have a plurality of first terminals to which the plurality of first wires are respectively coupled via the stitch part, and a second terminal to which the ball part of the second wire is coupled via the ball part;
   in plan view, the second terminal is located at a position different from over an arrangement of the plurality of first terminals; and
   in plan view, a width of the second terminal is larger than a width of each of the plurality of first terminals.

2. The semiconductor device according to claim 1, wherein, in plan view, a length of the second terminal in an extending direction is smaller than a length of each of the first terminals in an extending direction.

3. The semiconductor device according to claim 1, wherein in plan view, a width of the ball part of the second wire is larger than a width of the stitch part of the first wire.

4. The semiconductor device according to claim 1, wherein:
   over the first main surface of the first semiconductor chip, a second semiconductor chip having a second rear surface facing the first main surface of the first semiconductor chip, a second main surface opposite to the second rear surface and a second electrode formed over the second main surface is mounted;
   each of the ball parts of the first wires is coupled to the first electrodes of the first semiconductor chip; and
   the stitch part of the second wire is coupled to the second electrode of the second semiconductor chip.

5. The semiconductor device according to claim 1, wherein a planar shape of the second terminal is a circle.

6. The semiconductor device according to claim 1, wherein the chip-mounting surface of the wiring substrate is covered with an insulating film, and the first terminals and the second terminal are exposed from the insulating film at one opening part formed in the insulating film.

7. The semiconductor device according to claim 1, wherein:
   the first semiconductor chip has the first electrodes and a second electrode arranged along a first side of the first main surface;
   a separation distance between the second electrode and the first side is larger than a separation distance between each of the first electrodes and the first side;
   each of the ball parts of the first wires is coupled to the first electrodes; and
   the stitch part of the second wire is coupled to the second electrode.

8. The semiconductor device according to claim 1, wherein:
   the first semiconductor chip has the first electrodes, and the second electrode arranged along a first side of the first main surface;
   each of the ball parts of the first wires is coupled to the first electrodes;
   the stitch part of the second wire is coupled to the second electrode;
   the chip-mounting surface of the wiring substrate is covered with an insulating film, and the first terminals and the second terminal are exposed from the insulating film at one opening part formed in the insulating film;
   at the opening part, a first wiring, through which a current different from a current flowing through the second wire flows, is arranged; and
   in plan view, the second wire is provided so as to stride over the first wiring in a position overlapping the opening part in a thickness direction.

9. The semiconductor device according to claim 1, wherein:
   the first semiconductor chip has the first electrodes, and the second electrode arranged along a first side of the first main surface;
   each of the ball parts of the first wires is coupled to the first electrodes;
   the stitch part of the second wire is coupled to the second electrode; and
   the second wire is provided so as to stride over a part of the first wires.

10. The semiconductor device according to claim 1,
wherein, in plan view, a length of each of the first terminals in an extending direction is larger than a width of each of the first terminals.

11. The semiconductor device according to claim 1, wherein:
the second terminal has a planar shape of a circle, and has a first part to which the ball part of the second wire is coupled, and a second part that is linked to the first part and extends along an extending direction of the second wire; and
the second part of the second terminal is provided over an arrangement of the first terminals.

12. The semiconductor device according to claim 1,
wherein, in plan view, each of the first terminals is formed in a position more close to the first semiconductor chip than the second terminal.

13. A method of manufacturing a semiconductor device, comprising:
providing a wiring substrate having a chip-mounting surface, and a plurality of terminals formed on the chip-mounting surface;
mounting a semiconductor chip having a main surface, a plurality of electrodes formed over the main surface, and a rear surface opposite to the main surface over the chip-mounting surface of the wiring substrate such that the rear surface of the semiconductor chip faces the chip-mounting surface of the wiring substrate; and
after the mounting of the semiconductor chip, electrically coupling the plurality of terminals of the wiring substrate to the plurality of electrodes of the semiconductor chip via a plurality of wires, respectively,
wherein:
in plan view, the plurality of terminals are arranged along a side of the first main surface of the first semiconductor chip in series;
the plurality of terminals have a plurality of first terminals arranged over a first arrangement, and a second terminal arranged over a second arrangement located at a position different from over the first arrangement;
in plan view, a width of the second terminal is larger than a width of each of the plurality of first terminals;
each of the plurality of wires has a ball part and a stitch part;
the plurality of wires have a plurality of first wires to be respectively coupled to the plurality of first terminals, and a second wire to be coupled to the second terminal; and
the electrically coupling of the plurality of terminals includes:
a first bonding process in which the plurality of first wires are respectively coupled to the plurality of first terminals via the stitch part; and
a second bonding process in which the second wire is coupled to the second terminal via the ball part.

14. The method of manufacturing a semiconductor device according to claim 13,
wherein, in plan view, a length of the second terminal in an extending direction is smaller than a length of each of the first terminals in an extending directions.

15. The method of manufacturing a semiconductor device according to claim 13,
wherein the chip-mounting surface of the wiring substrate is covered with an insulating film, and the first terminals and the second terminal are exposed from the insulating film at one opening formed in the insulating film.

16. A method of manufacturing a semiconductor device comprising the steps of:
providing a wiring substrate having a chip-mounting surface, and a plurality of terminals formed on the chip-mounting surface;
mounting a first semiconductor chip having a plurality of first electrodes formed over a first main surface, and a first rear surface opposite to the first main surface, over the chip-mounting surface of the wiring substrate such that the first rear surface of the first semiconductor chip faces the chip-mounting surface of the wiring substrate;
after the mounting of the first semiconductor chip, mounting a second semiconductor chip having a second main surface, a second electrode formed over the second main surface, and a second rear surface opposite to the second main surface, over the first main surface of the first semiconductor chip such that the second rear surface of the second semiconductor chip faces the first main surface of the first semiconductor chip; and
after the mounting of the second semiconductor chip, electrically coupling the plurality of terminals of the wiring substrate to the plurality of first electrodes of the first semiconductor chip and the second electrode of the second semiconductor chip via a plurality of wires, respectively,
wherein:
in plan view, the plurality of terminals are arranged along a side of the first main surface of the first semiconductor chip in series;
the plurality of terminals have a plurality of first terminals arranged over a first arrangement, and a second terminal arranged over a second arrangement located at a position different from over the first arrangement;
in plan view, a width of the second terminal is larger than a width of each of the plurality of first terminals;
each of the plurality of wires has a ball part and a stitch part;
the plurality of wires have a plurality of first wires to be respectively coupled to the plurality of first terminals and a second wire to be coupled to the second terminal; and
the mounting of the second semiconductor chip includes:
a first bonding process in which the plurality of first wires are respectively coupled to the plurality of first terminals via the stitch part; and
a second bonding process in which the second wire is coupled to the second terminal via the ball part.

17. The method of manufacturing a semiconductor device according to claim 16,
wherein, in plan view, a length of the second terminal in an extending direction is smaller than a length of each of the first terminals in an extending direction.

18. The method of manufacturing a semiconductor device according to claim 16,
wherein the chip-mounting surface of the wiring substrate is covered with an insulating film, and the first terminals and the second terminal are exposed from the insulating film at one opening formed in the insulating film.

19. The method of manufacturing a semiconductor device according to claim 16, wherein:
- in plan view, the second terminal is formed in a position having distance from the first semiconductor chip farther than the first arrangement; and
- in the electrically coupling of the plurality of terminals, the second bonding process is performed after the first bonding process.

* * * * *